United States Patent [19]
Gormish et al.

[11] Patent Number: 5,710,562
[45] Date of Patent: Jan. 20, 1998

[54] METHOD AND APPARATUS FOR COMPRESSING ARBITRARY DATA

[75] Inventors: Michael J. Gormish, Los Altos; Edward L. Schwartz, Sunnyvale; Ahmad Zandi, Cupertino, all of Calif.; James D. Allen, J. Uthai Thani, Thailand

[73] Assignees: Ricoh Company Ltd., Tokyo, Japan; Ricoh Corporation, Menlo Park, Calif.

[21] Appl. No.: 521,750

[22] Filed: Aug. 31, 1995

[51] Int. Cl.$^6$ .................................................. H03M 7/30
[52] U.S. Cl. .......................... 341/107; 341/106; 341/51
[58] Field of Search ............................ 341/107, 51, 87, 341/106

[56] References Cited

U.S. PATENT DOCUMENTS

| | | | |
|---|---|---|---|
| 5,025,258 | 6/1991 | Duttweiler | 341/107 |
| 5,081,575 | 1/1992 | Hiller et al. | 395/325 |
| 5,357,250 | 10/1994 | Healey et al. | 341/107 |
| 5,414,423 | 5/1995 | Pennebaker | 341/107 |
| 5,485,609 | 1/1996 | Vitter et al. | 395/600 |
| 5,550,540 | 8/1996 | Furlan et al. | 341/51 |

OTHER PUBLICATIONS

Bell, Timothy C., Cleary, John G., Witten, Ian H., "Text Compression", pp. 140–166, 191–205, Prentice Hall, NJ, 1990.

*Primary Examiner*—Jeffrey A. Gaffin
*Assistant Examiner*—Jason L. W. Kost
*Attorney, Agent, or Firm*—Blakely, Sokoloff, Taylor & Zafman

[57] ABSTRACT

An encoding and decoding system that includes a model implemented hardware or software that is capable of operating on arbitrary data (e.g., data of a different or variety of types.) The model generates a context and binary decision for each symbol, which a binary entropy coder that uses to generate a compressed bit stream. One context model is operable with arbitrary data and uses context bins of various orders to generate a context and a decision for each symbol in an input symbol stream. An entropy coder estimates probability and generates compressed data stream in response to contexts and decisions from the model and according to generated probability estimates.

81 Claims, 18 Drawing Sheets

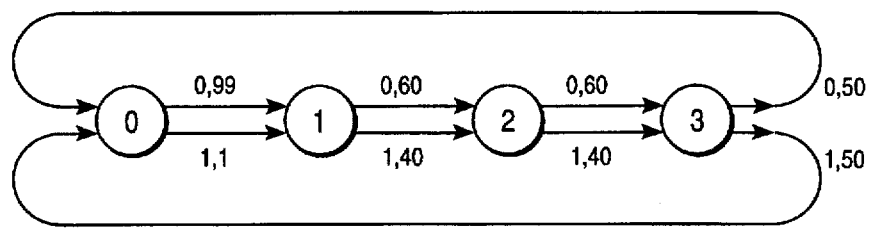
Fig. 4
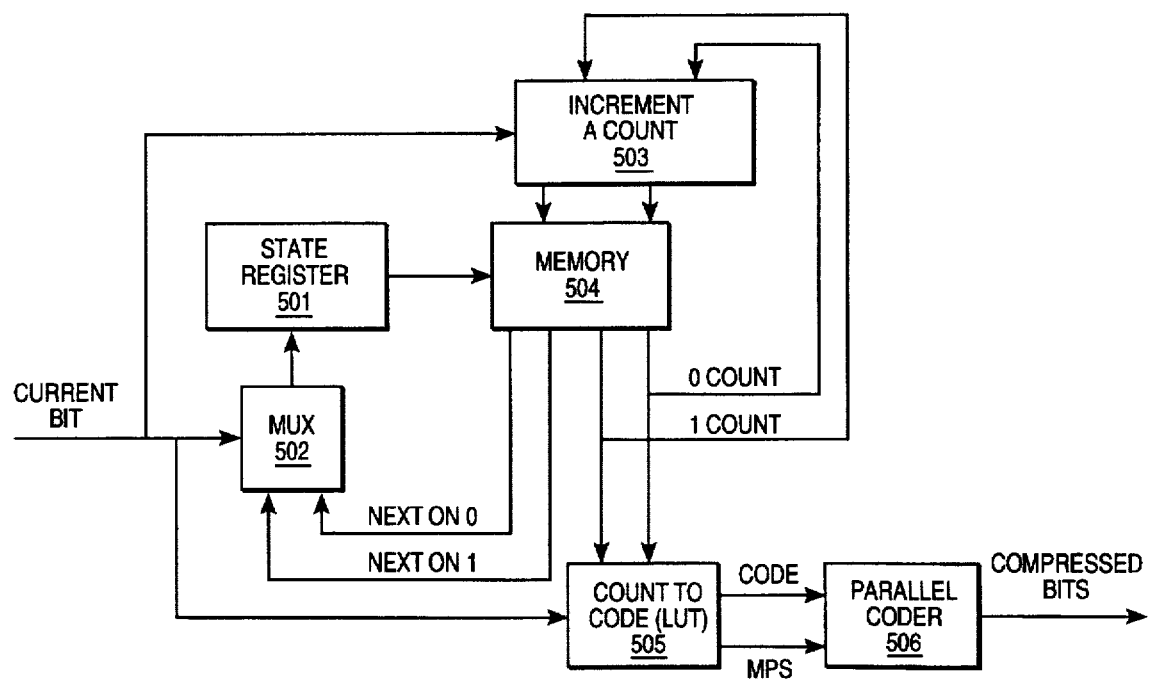
Fig. 5
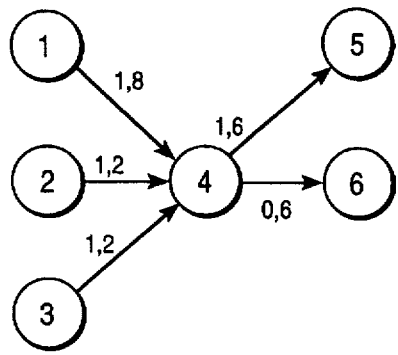     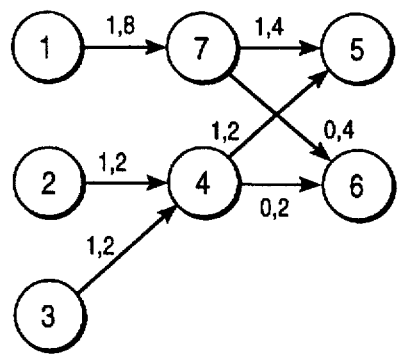
Fig. 6A              Fig. 6B

METHOD AND APPARATUS FOR COMPRESSING ARBITRARY DATA

FIELD OF THE INVENTION

The present invention relates to the field of data compression and decompression systems; particularly, the present invention relates to context models capable of accommodating arbitrary data (e.g., data from multiple types of sources or in multiple types of formats).

BACKGROUND OF THE INVENTION

Data compression is an extremely useful tool for storing and transmitting large amounts of data. For certain types of data, compression must always be "lossless" or "reversible". In other words, after compression and decompression, the data must be exactly the same as the original data. Lossless coding methods include dictionary methods of coding (e.g., Lempel-Ziv family of algorithms), run-length coding, enumerative coding and entropy coding.

Sometimes, due to the large amount of input data and limited bandwidth, even more compression is needed. In such a case, the decompressed data may not be exactly the same as the original data, but ideally it is close enough to make little or no difference. When the data that is produced after compression and decompression is not exactly the same as the original input data, the coding is lossy. Lossy coding methods may incorporate lossless coding as a subpart.

Entropy coding consists of any method of lossless coding which attempts to compress data close to the entropy limit using known or estimated symbol probabilities. Entropy codes include, for example, Huffman codes, arithmetic codes and binary entropy codes.

Binary entropy coders are lossless (i.e., perfect reconstruction is possible) coders which act only on binary (yes/no) decisions, often expressed as the most probable symbol (MPS) and the least probable symbol (LPS). Examples of binary entropy coders include IBM's Q-coder, a coder referred to herein as the FSM-coder, and a high-speed parallel coder. The FSM-coder is a binary entropy coder which uses a finite state machine for compression. For more information on the FSM-coder, see U.S. Pat. No. 5,272,478, entitled "Method and Apparatus For Entropy Coding" and issued Dec. 21, 1993. For more information on an example of a high-speed parallel coder, see U.S. Pat. No. 5,381,145, entitled "Method and Apparatus for Parallel Decoding and Encoding of Data" and issued Jan. 10, 1995.

All data compression systems can be divided, at least conceptually, into two parts: a context model and a coder. For encoding, data is input into the context model which translates the input data into a sequence of decisions and provides a context bin for each decision. Both the sequence of decisions and their associated context bins are output to the coder. The coder receives each context bin and generates a probability estimate for each decision. The coder also determines whether the decision (result or event) is or is not in its more probable state. Based on the probability estimate, the coder's determination and whether or not the decision was likely, the coder produces a compressed data stream, outputting zero or more bits, to represent the original input data. For decoding, the context model provides a context bin to the coder. Based on the context bin, the coder provides a probability estimate which together with the compressed bit stream causes the coder to return a bit representing whether the decision (i.e., the event) is in its most probable state. The context model receives the return bit, generates the original data based on the received bit, and updates the context bin for the next binary decision.

The context model is typically application specific. That is, typically, context models are designed based on the data to which they are going to receive. Because of this, compression and decompression systems using context models specifically designed for a specific type of data are able to achieve better compression than those which are not designed specifically for the types of data being compressed. It would be desirable to have a context model that can be used with any type of data.

A Prediction by Partial Match version C coder (PPMC) introduced by Bell, Cleary and Witten is a variable order markov compressor that uses a M-ary (256-ARY) arithmetic coder. See Bell, Cleary, Witten, Text Compression, Prentice Hall, 1990. The PPMC context model and the M-ary arithmetic coder are computationally intensive.

Consider an example of PPMC coding the "x" in the string "abcabx." Since "abcab" has already been coded, the 0th order probability estimates or context bins "a", "b", and "c" have already been allocated and initialized. Similarly, 1st order probability estimates or context bins include the probability of "b" given that the previous character was "a" (P("b"|"a")), the probability of "c" when the previous character was "b" (P("c"|"b")), and the probability of "a" when the previous character was "c" (P("a"|"c")). The 2nd order context bins that have been allocated and initialized include the P("c"|"ab") and P("a"|"bc"). The 3rd order context bin P("a"|"abc") has been allocated and initialized. A PPMC coder updates a probability estimate for each of these context bins when encoding and decoding. A PPMC coder also maintains a probability estimate for other context bins, which is an escape code that indicates that a lower order context must be used. The escape probabilities are to handle those situations where a probability is not assigned. A "−1"th order context, where every symbol is equally likely is used to handle the first occurrence of each symbol.

Table 1 shows the probability estimates for various context bins where $\gamma$, $\beta$, and $\delta$ are probability estimates with values between 0 and 1. It is assumed that 8-bit characters are used, resulting in a 256 element alphabet. Note that in Table 1, "P("c"|"ab")=$\beta$" means that given that the previous two characters were "ab", the probability estimate for the next character being "c" is $\beta$.

TABLE 1

PPMC Context Bins

Probabilities for Previously Used Context Bins

| | |
|---|---|
| 4th order | P(escape \| "bcab") = 1 |
| 3rd order | P(escape \| "cab") = 1 |
| 2nd order | P("c"\|"ab") = $\beta$, P(escape \| "ab") = 1 − $\beta$ |
| 1st order | P("c"\|"b") = $\gamma$, P(escape \| "b") = 1 − $\gamma$ |
| 0th order | P("a") = P("b") = $\delta$, P("c") = $\gamma$, P(escape) = 1 − 2$\delta$ − $\gamma$ |
| −1th order | P(any character) = 1/253 |

To code the "x" in the string "abcabx", first the PPMC coder checks to see if there is a 4th order estimate for "x" following "bcab", and since there is not, an escape is coded. Note that this consumes no code space when the probability of escape is 1. On the other hand, in the 2nd order estimate, the probability of the escape is 1-$\beta$, not 1. Since the probability is no longer 1, code space is consumed. This process is repeated for each order, and since no matches occur, escapes are coded until order "−1th" is reached and then the "x" is coded. After coding, all orders have their probabilities updated for the occurrence of "x". The updated context bins are "bcab", "cab", "ab", "b" and the 0th order context. Now, if the string "bcabx" occurred again, the "x" would be coded with a 4th order context bin. If the string "zzabx" occurred, the "x" would be coded with a 2nd order context bin ("ab").

One problem with a PPMC coder is the use of escape probabilities. Escape probabilities are required to accommodate estimates that do not exist for selected alphabet data in the M-ary total. It is very difficult to accurately assign probabilities to the escape codes.

Another problem with using PPMC is that it is intended to be run on a large, general purpose computing system. Each context is located through a tree structure. As the PPMC coder compresses the data, a tree is built in such a way that it is assumed that memory is not limited. However, such a system does not work effectively when memory is limited, such as with integrated circuits. Therefore, it is desirable to have a system that accommodates arbitrary types of data when limited by the amount of memory available.

Almost all general purpose data compression methods today are based on one of two methods of dictionary compression described by Ziv and Lempel. These are referred to as LZ77 and LZ78. These methods store the previous characters and code new characters by referring to sequences by identical previous characters. Ziv/Lempel methods are used in many software and hardware systems.

Dynamic Markov compression (DMC) was suggested as a method by which a context model for the compression of general purpose data may be built dynamically. The method typically provides better compression than most dictionary methods. Instead of using a set of previous bits as a context, DMC uses states in .a directed graph.

The present invention provides context models for compression of arbitrary data.

SUMMARY OF THE INVENTION

A method and apparatus for encoding and decoding information is described. The method and apparatus include a model implemented in hardware or software that is capable of operating on arbitrary data (e.g., data of a different or variety of types.) The model generates a context and binary decision for each symbol. The present invention also includes a binary entropy coder that estimates probabilities and generates a compressed bit stream in response to contexts and the binary decisions from the model.

In one embodiment, the present invention includes a context model that is operable with arbitrary data and uses context bins of various orders to generate a context and a decision for each symbol in an input symbol stream. An entropy coder estimates probability and generates compressed data stream in response to contexts and decisions from the model and according to generated probability estimates.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 4 illustrates an example DMC graph.

FIG. 5 illustrates a block diagram of one embodiment of a DMC context model.

FIG. 6A illustrates an example DMC graph that is to have a split state.

FIG. 6B illustrates an example DMC graph after the state in FIG. 6A has been split.

DETAILED DESCRIPTION OF THE PRESENT INVENTION

Figure 1A:
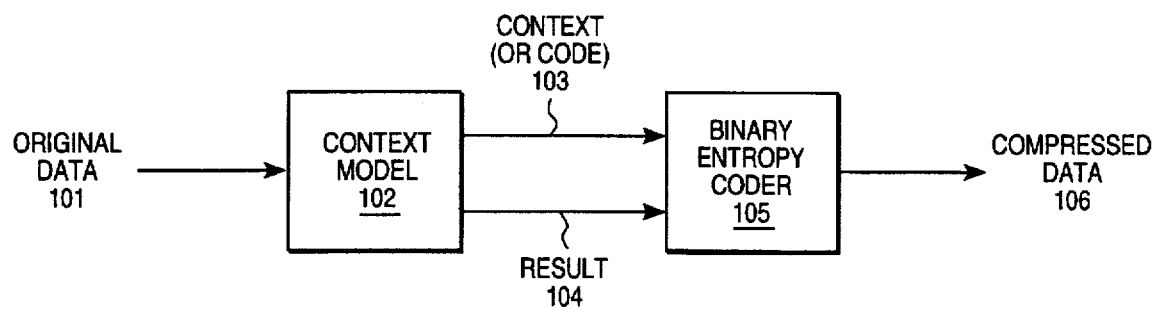
FIG. 1A is a block diagram of a binary entropy coding system.

A compression and decompression system for handling arbitrary data is described. In the following detailed description of the present invention numerous specific details are set forth, such as specific data types, numbers of bits, etc., to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transfer (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. The algorithms and displays presented herein are not inherently related to any particular computer or other apparatus. Various general purpose machines may be used with programs in accordance with the teachings herein, or it may prove convenient to construct more specialized apparatus to perform the required method steps. The required structure for a variety of these machines will appear from the description below. In addition, the present invention is not described with reference to any particular programming language. It will be appreciated that a variety of programming languages may be used to implement the teachings of the invention as described herein.

Overview of the Present Invention

Figure 1B:
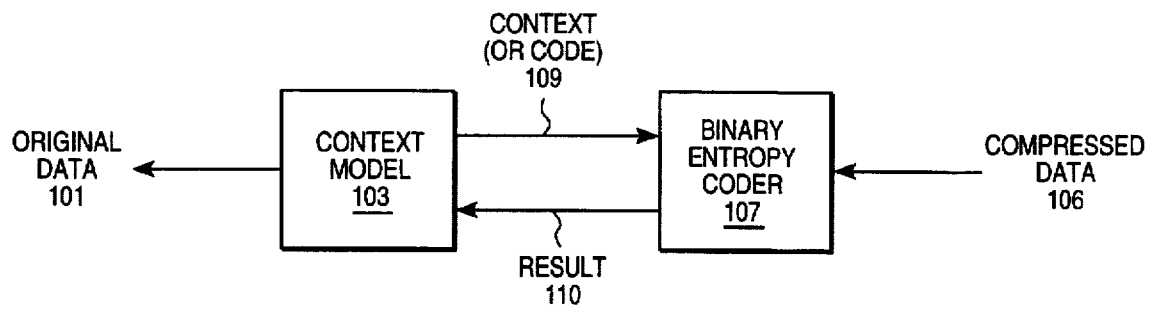
FIG. 1B is a block diagram of a binary entropy decoder system.

The present invention provides a compression and decompression system having a context model and a binary entropy coder. FIG. 1A illustrates one embodiment of the compression system of the present invention, while FIG. 1B illustrates one embodiment of the decompression system of the present invention. The compression system and decompression system operate together to form a lossless compression scheme.

Referring to FIG. 1A, original data 101 is input into context model 102. Original data 101 may be arbitrary data. In other words, original data 101 may comprise a variety of types of data such as data from text, executables, source files, images, numerical data, etc. Such data may be derived from, a variety of sources such as, for instance, networks, disk drives, flash memories, magneto-optical disks, optical disks, scanners or other sensors, etc.

In response to data 101, context model 102 generates a set or sequence of decisions. In one embodiment, each decision comprises a binary decision. Context model 102 also provides a context for each decision. Context model 102 outputs a context 103 and a result indicating the outcome of the decision. For a binary entropy coder, result 104 comprises a single bit. In one embodiment, context model 102 may output a code (probability class).

A binary entropy coder 105 receives context 103 and result 104 and generates a compressed bit stream 106. In response to these inputs, binary entropy coder 105 estimates the probability of the inputs and attempts to produce compressed data 106 as a bit stream with a length as close as reasonably possible to the entropy of the probability estimate. In one embodiment, binary entropy coder 105 may comprise a coder as described in U.S. Pat. No. 5,381,145, entitled "Method and Apparatus for Parallel Decoding and Encoding of Data", issued Jan. 10, 1995 or entropy coder 105 may comprise a finite state machine binary coder, such as described in U.S. Pat. No. 5,272,478, entitled "Method and Apparatus for Entropy Coding", issued Dec. 21, 1993.

Although only one binary entropy coder is shown, the context model of the present invention accommodates arbitrary data and may be used with multiple binary compressors operating in parallel. In one embodiment, the context model is coupled to multiple coders with each coder dedicated to a specific portion of an incoming bit stream. Such an embodiment is shown in U.S. Pat. No. 5,272,478.

Although the present invention provides a lossless compression system, the present invention may be configured as a lossy compression system and still provide better compression than systems available in the prior art that accommodate arbitrary data.

Referring to FIG. 1B, an embodiment of a decompression system comprising a context model 108 and binary entropy coder 107 performs the reverse process to decompress compressed data 106. Binary entropy coder 107 receives a context 109 from context model 108 as well as compressed data bit stream 106. Based on context 109, binary entropy coder 107 generates a probability estimate (or class of estimates). In one embodiment, context model 108 outputs a code (probability class) to binary entropy coder 107.

In response to the inputs, binary entropy coder 107 generates a result 110 indicative of whether a decision was in the most probable state or not. In one embodiment, binary entropy coder 107 returns a bit indication representative of the occurrence of the likely event. In response to result 110, context model 108 generates the original data 101.

Figure 1C:
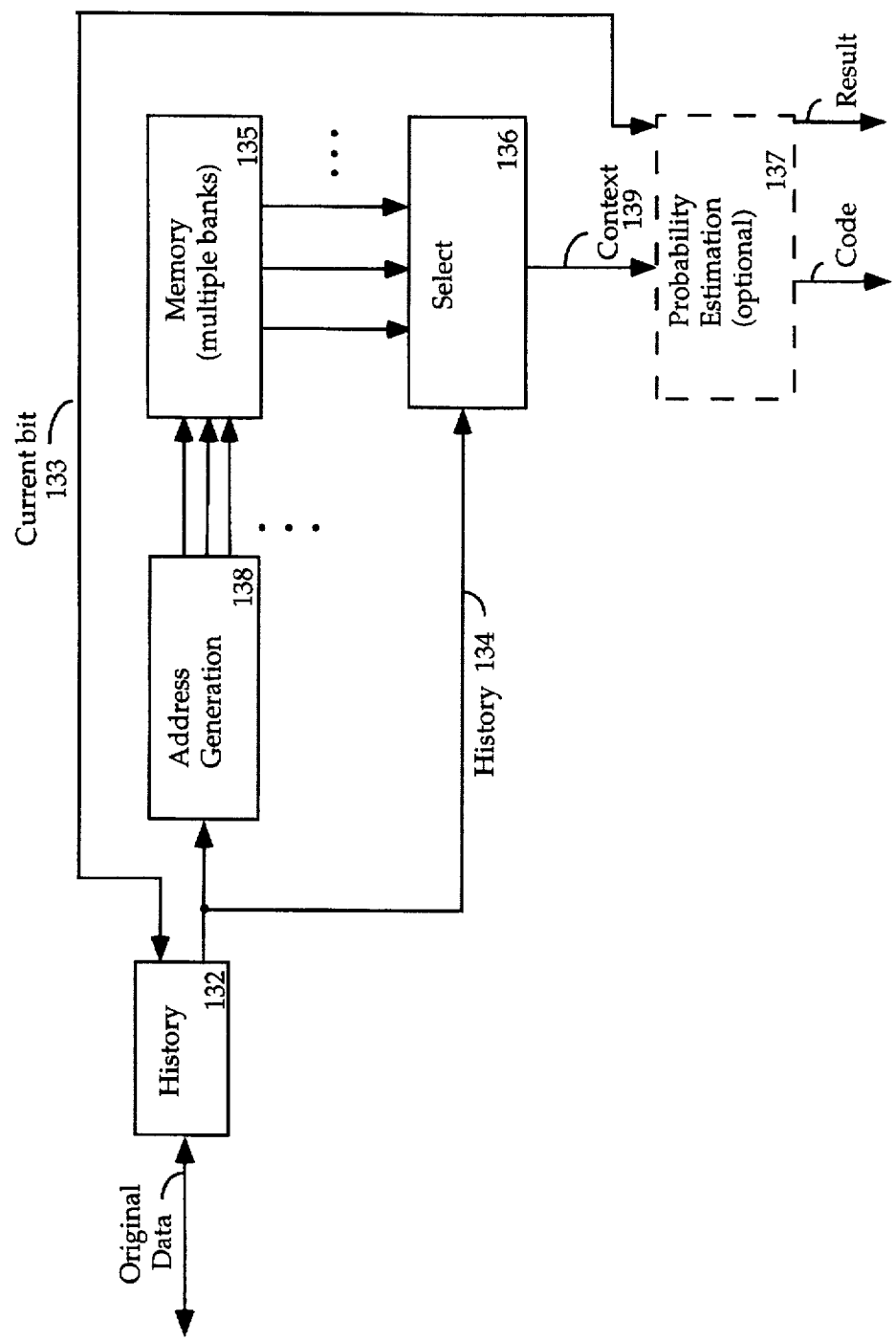
FIG. 1C is a block diagram of one embodiment of the context model of the present invention.

FIG. 1C is a block diagram of one embodiment of context model of FIGS. 1A and 1B. Referring to FIG. 1C, the original data 131 is input into the history block 132. History block 132 buffers previous bytes or other units of data. History block 132 is also coupled to receive or transmit the current bit 133. Based on the original data 131 and the current bit 133, history block 132 generates history information 134.

Address generation block 138 is coupled to receive the history information 134 (or some portion thereof). In response to history information 134, address generation block 138 generates multiple addresses to access multiple banks of memory 135. In one embodiment, address generation block 138 comprises a hashing mechanism. The output of memory 135 comprises multiple contexts. Selection block 136 is coupled to receive the contexts from memory 135 as well as history information 134. Based on the history information 134 and information from memory 135, selection block 136 selects the best potential context 139 out of the contexts from memory 135. Context 139 may be output, or optionally input into a probability estimation block 137. The probability estimation block 137 also receives the current bit. In response to these inputs, probability estimation block 137 generates a code (e.g., probability class) and a result. This, in turn, is converted to a compressed bit stream.

Figure 1D:
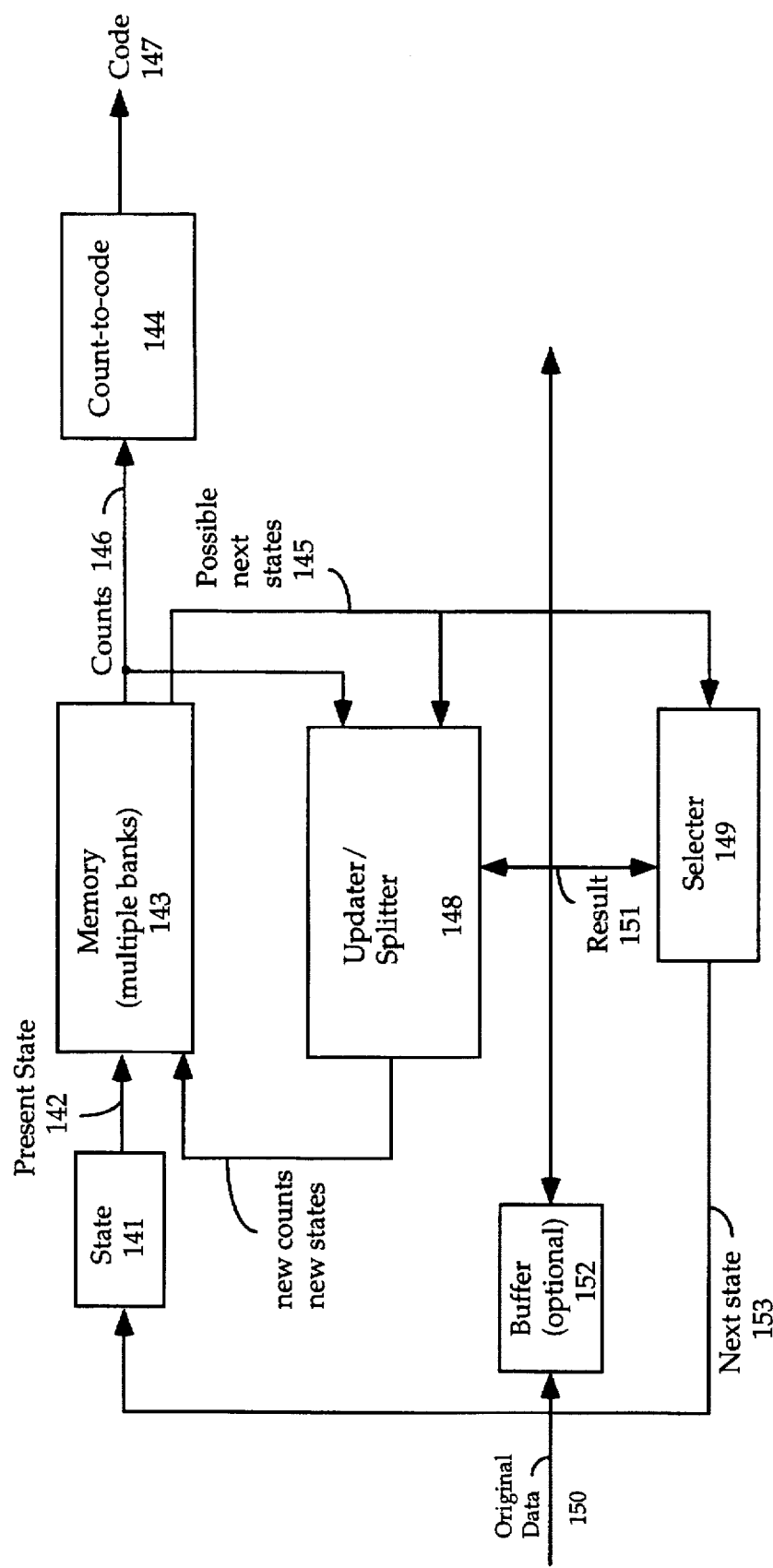
FIG. 1D is a block diagram of an alternate embodiment of the context model of the present invention.

FIG. 1D is a block diagram of an alternate embodiment of the context model of FIGS. 1A and 1B. Referring to FIG. 1D, original data 150 is received as an input, and may (optionally) be buffered in buffer unit 152. A portion of the original data is result 151. State 141 (e.g., register) stores the present state 142, which it receives as the next state 153 from selector 149. Memory 143 contains multiple banks and is coupled to receive present state 142. In response to present state 142, memory 143 is accessed and provides counts 146 and possible next states 145. In one embodiment, possible next states 145 comprises two states. Count-to-code block 144 is coupled to receive counts 146 and generates code 147 in response thereto. Note that code 147 may comprise a context or probability class (optionally).

Selector 149 is coupled to receive result 151 and possible next states 145. Based on the current bit, selector 149 selects one next state 153 from the possible next states 145, which is sent to state 141.

Updater/splitter block 148 is coupled to receive counts 146, possible next states 145, and result 151. In response to these inputs, Updater/splitter block 148 updates the counts and sends the new counts to memory 143. Updater/splitter block 148 also determines if any states need to be split, and, if so, sends the new states to memory 143. State splitting, and other aspects relating to this context model are described in further detail below.

One Embodiment of the Context Model of the Present Invention

One embodiment of the context model of the present invention uses multiple orders of binary Markov contexts. Such a context model may be the context model described in FIG. 1C.

In one embodiment, the present invention comprises a context model that uses 0th order contexts, 1st order contexts, 2nd order contexts, etc. The present invention provides for higher variable order context models, approximating Nth order for N greater than or equal to 2. Using a series of context model orders, the context model of the present invention is able to generate decisions and contexts in response to arbitrary data.

In the present invention, a 0th order context model uses no history of prior symbols. Coding is performed simply according to the frequency of the occurrence of each symbol in the alphabet. In one embodiment, context model of the present invention uses bytes of data. In such a case, the alphabet includes 256 symbols.

In the present invention, when using a 0th order context model with a binary entropy coder, eight binary decisions are made for each symbol (at a minimum). To model 0th order M-ary statistics, binary decisions are not made independently and are performed sequentially with each binary decision using all past decisions in the same symbol as a context.

In one embodiment, a 1st order context model uses one previous byte of Markov state information. In such a case, 16 bits of context information are required for 256×255 number of context bins. The 16 bits of information correspond to 8 bits of the previous byte and 8 bits (with one value unused) for the 0th order contexts.

In one embodiment, a 2nd order context model uses two previous bytes of Markov state information. In such a case, 24 bits of context information are used for 256×256×255 context bins. Of the 24 bits, 16 bits are for the two previous bytes and 8 bits are for describing symbol frequency.

An N-order context model uses N previous bytes of standard information and requires 8×(N+1) bits for $2^{8N} \times 255$ context bins. Note that the previous byte or bytes used for context do not have to be the immediately preceding byte(s). Instead, it may be advantageous to set forth contexts based on bytes or data that has regularly occurring but skipped pattern. For instance, in the case of RGB data, all contexts related to the red data may be modeled based on only bytes of the red data that already are known, such that bytes of blue and green data are skipped.

In the present invention, all contexts are not available, or active, all the time during the coding process. Initially, only lower order contexts are active, with higher order contexts becoming active as coding continues. Generally, high order context models suffer from the problem that a huge number of probability estimates are needed, and only a small amount of data may occur in many of the context bins. This results in many poor probability estimates. The present invention accelerates probability estimation by adaptively using different order models. The present invention uses a lower order context until a particular high order context occurs often enough that it is reasonable enough to expect that a good probability estimate can be made and that using a high order model will allow for better compression. At that point, the context is "split", thereby allowing the particular high order context to be used. The splitting of lower order context bins to allow the use of higher order context bins is described below. Note that the splitting mechanism discussed above is different than the splitting described in the alternative DMC embodiment below of the context model.

In one embodiment of the present invention, for each bit in a character in the input data stream, the context model examines all various possible orders to determine the highest order active context bin that applies to the bit and codes with that order. Note that the context is active if a probability estimate exists for it. The context model of the present invention searches from the highest order to the lowest order to find an active context bin to code each bit. Thus, the context model attempts to code bits with the most number of previous characters that can be made use of and works downward coding with the highest order possible. The psuedo code below represents the operation of the context model:

for each bit in current character do for order=maximum
   downto 0 do if context_bin(order) is active then code
   with order if order<maximum then update (order+1)
   break out of "for order" loop Note that in one embodiment, the context model hashes to a location in memory that is used for the context to determine if it is active. Hashing is described in further detail below.

The highest order available may not always be used to model the data. For instance, the probability estimate for a lower order context may be better (i.e. more representative) than the higher order and, thus, would be a better candidate. The determination of when to use a higher available order of context is a design choice.

In one embodiment, only 0th order context bins are active initially. Therefore, all coding uses 0th order context bins. As each 0th order context is used, the statistics corresponding to 1st order contexts are updated. During each update, the context splitting logic of the present invention determines if a particular 1st order context bin should be activated for further use. It is only after a 0th order context bin is used that a 1st order context bin may be activated. Similarly, once an activated 1st order context bin is used, a 2nd order context bin will be updated. This continues until all context bins that are used by the data and are supported by the particular implementation of the present invention are active.

The number of orders supported by the particular implementation is limited by the maximum number of orders allowable. The maximum allowable number of orders may be dependent on the memory available to store contexts and probability estimates in the system. The maximum order may be three, four, five, six, or higher orders, especially if the characters are less than eight bits.

Although the embodiment described above illustrates a context model that begins with 0th order contexts, this is not a requirement. The context models may begin with Nth order contexts, where N is 1 or greater. The present invention may be used where an initial number of contexts of various orders are used and later adapted.

In one embodiment, given a choice between using several context bin of different orders, the coder with the most skewed context bins that has the same MPS (most probable symbol) as the highest order context bin that has occurred before is selected. In such a case, context bins that are not used for coding, but could have been used, have their PEM states updated if the MPS is not different from the MPS used in coding and the number of times that context has been hit is less than a threshold, which is described in more detail below. Note that hitting a context means to use it for coding or to use one order lower for coding.

Figure 2:
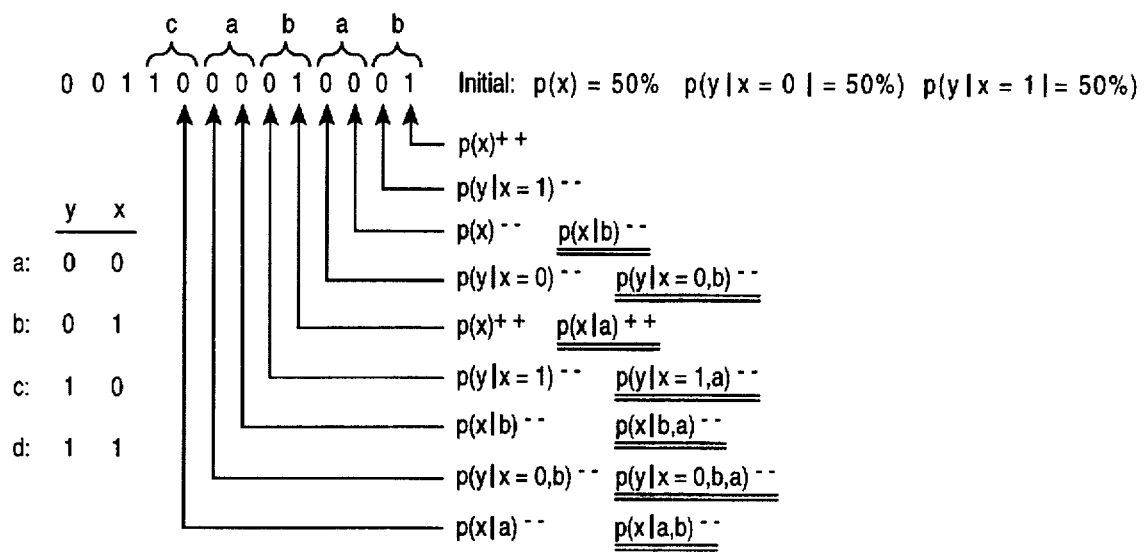
FIG. 2 illustrates an example of the context splitting of the present invention.

FIG. 2 illustrates an example of the adaptive context model processing of the present invention that creates and utilizes higher order contexts while coding data. Referring to FIG. 2, a stream of data bits is shown representing XY pairs of data bits, and is being coded from right to left. The "XY" pairs are two bits coded at a time (2 bit symbols), in which order selection is based on symbols, not bits. Initially the probability of an X(p(x)) is 50%. The probability of Y being equal to 1 when x is 0 (p(y=1|x=0)) is 50%. Likewise the probability of Y being equal to 1 when X equals 1 (p(y|x=1)) is 50% as well. Upon coding the first X, i.e. the first bit, the probability that X is a 1 is increased (++).

When the second bit is coded, it is coded based on the fact that the X is 1 and the probability of Y being 1 when X is 1 is decreased (−). Similarly, when a third bit is coded, the probability of X being 1 decreases. However, at this point the first "first order" context is created (i.e., p(x|b)) and its probability is lowered. That is, the probability of X being 1 when following a "b" decreases.

When the fourth bit is encountered, it is coded with its probability and the probability of Y being 1 when X equals zero is decreased. However, a new context is created at this point. The context created is the probability of Y being 1 when preceded by an X equal to zero and a "b". This probability of Y being 1 is decreased. The process continues with various probabilities being generated.

It should be noted when at the seventh bit position where the probability of X being 1 when preceded by "b" is decreased, the probability of X by itself (p(x)) is no longer updated nor used as a context. Furthermore, a new context is created, the p(x|b, a). That is, the context of the probability of X being 1 when preceded by "b" and "a" is created and its probability of being 1 is decreased. This is the first "second order" context. When the next Y bit is coded, the probability of Y being 1 when followed by an X equal to zero, and a "b" is the context and is decremented. Note that the first context is no longer updated or used in this case.

Context Splitting and Fast Adaptation

The context splitting logic of the present invention determines when a new context bin is to be activated. In order to determine when to activate a new context bin, the context model of the present invention balances two conflicting goals. One, the context splitting logic desires to use as much past history as possible. In other words, the context model desires to use as many high order context bins as possible that allows future data to be predicted and coded well. However, using fewer context bins allows practical implementations, particularly when less memory is available, and allows good probability estimates to be made for each context. Fewer context bins and good probability estimates means more data per context, which is required for good compression.

In one embodiment, a particular high order context bin is activated when a count value reaches a threshold. Each time an Nth order context bin is used, a count value for an associated N+1th order context is incremented. If the count value is increased by a constant each time a context is used, then waiting until the threshold is reached ensures that the context is used frequently enough that it is reasonable to expect that a good probability estimate can be determined for it. The threshold is chosen based on how long it takes to obtain a good probability estimate. In one embodiment, the threshold is seven.

In an alternate embodiment, the amount to increment the value is related to how close the probability estimate of the Nth order context is to 50%. For a R-coder based system using a state table, such as a table disclosed in U.S. Pat. No. 5,272,478, where probability estimation (PEM) state 0 is for the 50% probability class and the maximum PEM state is for the most skewed probability class, the amount to increment is the maximum PEM state minus the current PEM state.

In one embodiment, a context bin that has adapted to a maximum skew code will not split to use higher order contexts. This is advantageous since it is already being coded by the maximum amount and nothing can be gained by going to a higher context. Coding the most significant bit of ASCII files, which is always zero, is an example where the 0th order model achieves all the compression possible, and splitting the context to use higher order models is not desirable. In one embodiment, preference is given to splitting contexts that are being compressed poorly. In other words, preference is given to those that have low skew.

Probability Estimate Acceleration for Activated Context

The present invention provides for improved compression through the use of an adaptation rate of probability estimation. In one embodiment where R-codes are used in a PEM state table, a set of states may be used initially to provide for fast adaptation. An example of such a table is shown in U.S. patent application Ser. No. 08/172,646, entitled "Method and Apparatus for Parallel Encoding and Decoding of Data", filed Dec. 23, 1993.

When a context bin reaches a threshold and is activated, several choices exist for the probability estimate for the context bin. A default 0 PEM state may be used. Alternatively, the PEM state from the lower order context may be used. Another alternative is to keep track of the bits that would have been coded in the inactive N+1th order context when coding data in the Nth order context so that a good initial probability estimate can be made. In one embodiment, a record of the previous bits is maintained for use in determining the correct most probable symbol (MPS) for a newly activated context bin, which is then used with the PEM state from the lower order context bin.

Other accelerations to probability estimation include the following. If the MPS of the higher order context is different from the lower order context, the PEM state of one or both context can be increased. If no least probable symbol (LPS) occurs in the higher order context prior to activation, the PEM state of the higher order context can be increased. These types of acceleration are easily implementable in hardware or software by those skilled in the art.

Assigning and Accessing Memory for Contexts

In the present invention, memory is allocated to contexts as they are used to avoid the need to have large memories. Therefore, the context model of the present invention is intended for use in systems with limited memory. The decision on whether to allocate memory to a higher order context bin is made based on the fact that memory is limited. The present invention also uses hashing to attempt to use as many high order contexts as possible in a fixed amount of memory. For example, hashing is used to reduce 24-bit contexts to $2^8$ or $2^{16}$ memory locations, which may be used if available. The present invention resolves hash collisions by using lower order contexts so that context bins are never combined arbitrarily. The use of hashing in the present invention avoids the use of time consuming search operations and will be described later.

In one embodiment, the present invention does not provide memory for every possible context, particularly all second order and higher order contexts. In the present invention, memory is assigned to higher order contexts using a hashing function. In one embodiment, all second and third order context are assigned memory via hashing. For example, a 64K bank of memory may be assigned to the 24M possible second order contexts.

The memory location for each hashed context contains, in addition to the probability estimation context splitting information, the full description of the context assigned to the hash value. When a hash collision occurs, only the context that matches the full description of the context is allowed to use that particular hashed memory location. A hashed context memory location is dedicated to a single context and hashing does not cause any context to be combined.

There are numerous possible hashing functions. In one embodiment, the present invention may use hashing functions such as modular arithmetic, exclusive-or trees, look-up tables (LUTS) with random values, etc. A single hashing function may point to multiple memory locations or multiple hashing functions can be used. In one embodiment, [A+137B] modulo (MOD) 256 is used as a hashing function for two 8 bit values, A and B, and uses four memory locations per hash value. Zero and first order context bins do not use hashing. Second order context use 64K bank of memory addressed by 8 bits from hashing the two previous characters and 8 bits from hashing the previous character and the zero order information. Third order contexts use a 64K bank of memory addressed by 8 bits from hashing the previous character and the zero order information and 8 bits from hashing the second and third most previous characters.

Figure 7:
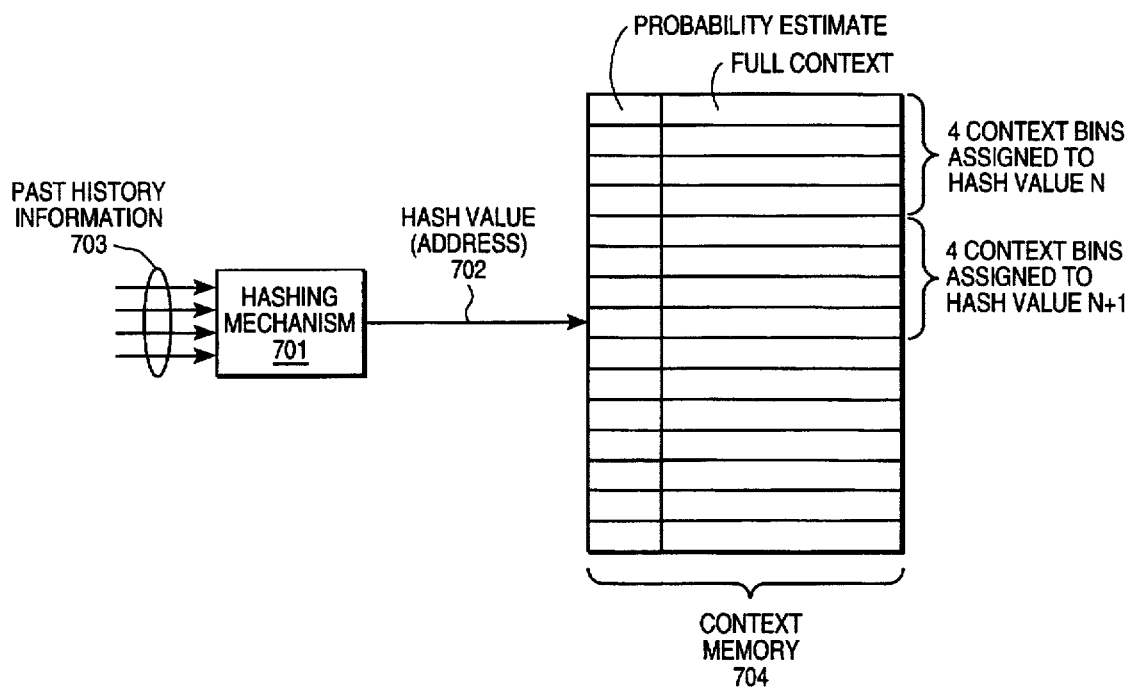
FIG. 7 illustrates a hashing mechanism of the present invention.

FIG. 7 illustrates the hashing of the present invention. Referring to FIG. 7, a hash is performed using a hashing mechanism 701 that receives past history and bit position to produce an address 702. In one embodiment, separate banks are used for each bit position. In this case, the hashing mechanism 701 generates the address 702 in response to the past history information. The address 702 is directed to cause the context memory 704 to be accessed. In one embodiment, each entry of context memory 704 has a probability estimate and a full context. Note that the probability estimate may be counts, as opposed to just being states. A predetermined number of entries are assigned to each hash value (address). In one embodiment, four context bins are assigned to each hash value. When the hash value 702 is generated, the multiple contexts (e.g., 4) corresponding to hash value 702 are read out of the context memory 704. At this point, the full context is compared to determine which of the multiple contexts is the actual context. By using such a hashing scheme, the number of search operations otherwise required to obtain the context are reduced.

Adaptive First Order Contexts

A fundamental difference between the present invention and PPMC in the prior art is that the present invention chooses when to split contexts. One of the consequences of this feature is that choices can be made adaptively among mutually exclusive context model bins. This allows the possibility of using different first order context models for data that is not in bytes. For example, for 16 bit data, the best first order predictor may be the second most previous byte, not the previous byte. One embodiment of the present invention using hashing allows the first order context to use the previous, second most previous, third most previous or fourth most previous byte to provide good predictions for 8 bit, 16 bit, 24 bit and 32 bit data respectively. Note that the size of data does not have to specified, it is adaptively determined. Another mutually exclusive context model that might be useful would be one that allows the adaptive selection of using 8-bit, 16-bit, 24-bit or 32-bit differences for numeric data.

Encoding/Decoding Processing of the Present Invention

In one embodiment, the present invention operates on bitplanes in order to take advantage of parallelism. This allows an input data stream to be coded progressively by bit planes, and to perhaps use future data on previous bitplanes as context for succeeding bitplanes. In an alternate embodiment, fixed size chunks may be coded in parallel. In still another alternate embodiment, variable size chunks of data may be processed in parallel starting with 0th order context bins.

It should be noted that running at high speeds may require a large amount of memory bandwidth. In one embodiment, the memory associated with each order context model may be accessed simultaneously.

FIGS. 3A-3E illustrate the encoding and decoding process of the present invention. It should be noted that the processing may be performed by dedicated hardware or software, or a combination of both. For instance, the process may be performed by a computer system running software.

Figure 3A:
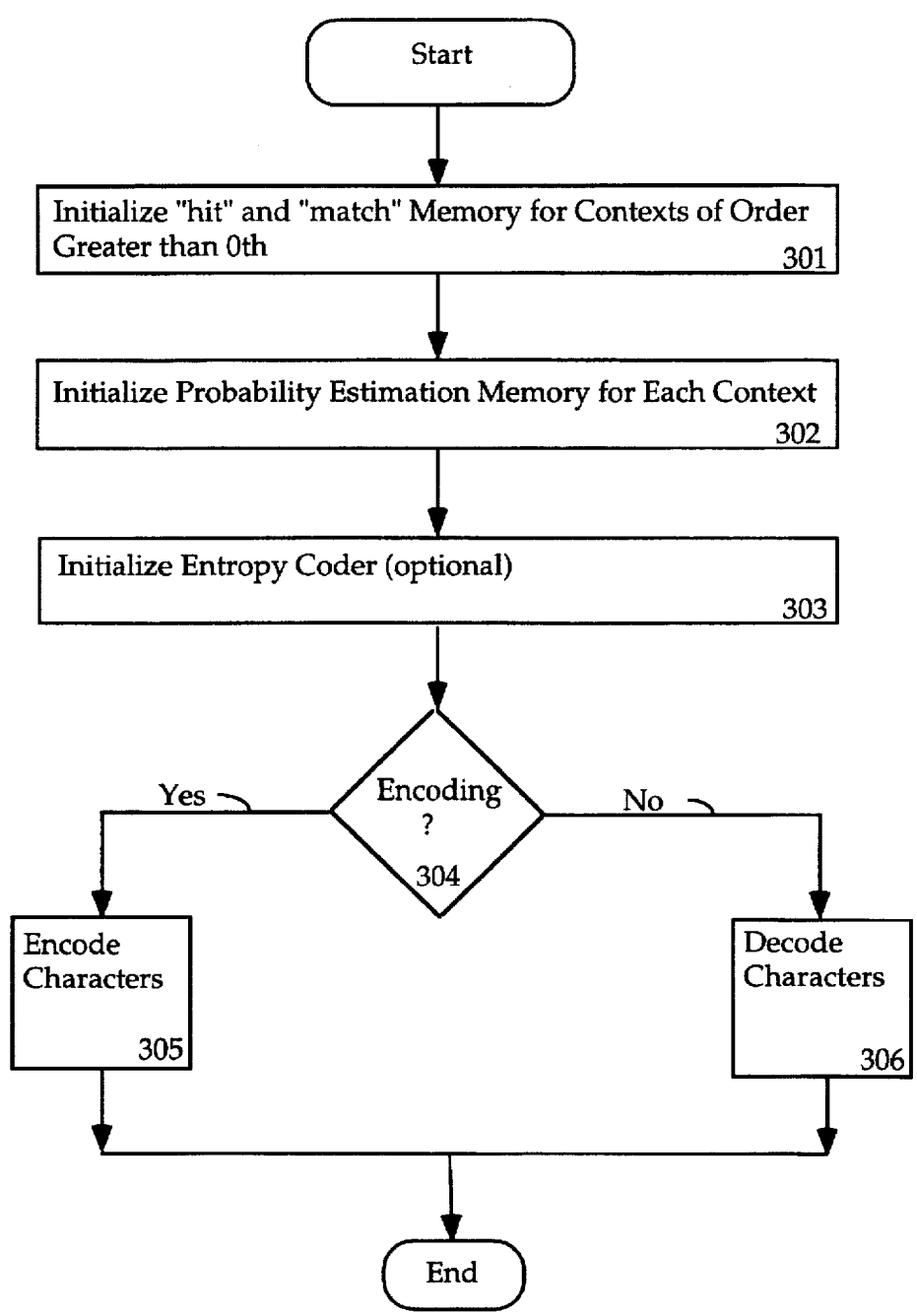
FIG. 3A is a flow chart of one embodiment of the encoding and decoding process of the present invention.

Referring to FIG. 3A, a flow chart of the encoding and decoding process of the present invention is shown. The process of the present invention begins with processing logic initializing the "hit" and "match" memory for contexts of orders greater that zero (processing block 301). The "hit" refers to a usage count that indicates how often a particular context is used for compression. A threshold may be included in the memory for use in determining the count at which a context may be split. The "match" memory refers to the memory storing the full contexts. Next, the probability estimate memory for each context is initialized (processing block 302). In one embodiment, a group of contexts are initialized as always active, such as the 0th order contexts, and the remaining contexts are either initialized to inactive at first but are allowed to be active later. Lastly, as part of the initialization process, processing logic initializes the entropy coder (processing block 303). Note that initializing the entropy coder is an optional step designed to set the entropy coder in a default initialization state, such as when the entropy coder has a set of states used in the beginning of processing to provide fast adaption.

A test then determines whether the process is performing encoding or decoding (processing block 304). If the process is performing encoding, the process continues at processing block 305 where processing logic encodes characters. If the process is performing decoding, the process continues at processing block 306 where processing logic decodes characters. After either of the encoding or decoding of characters, processing ends.

Figure 3B:
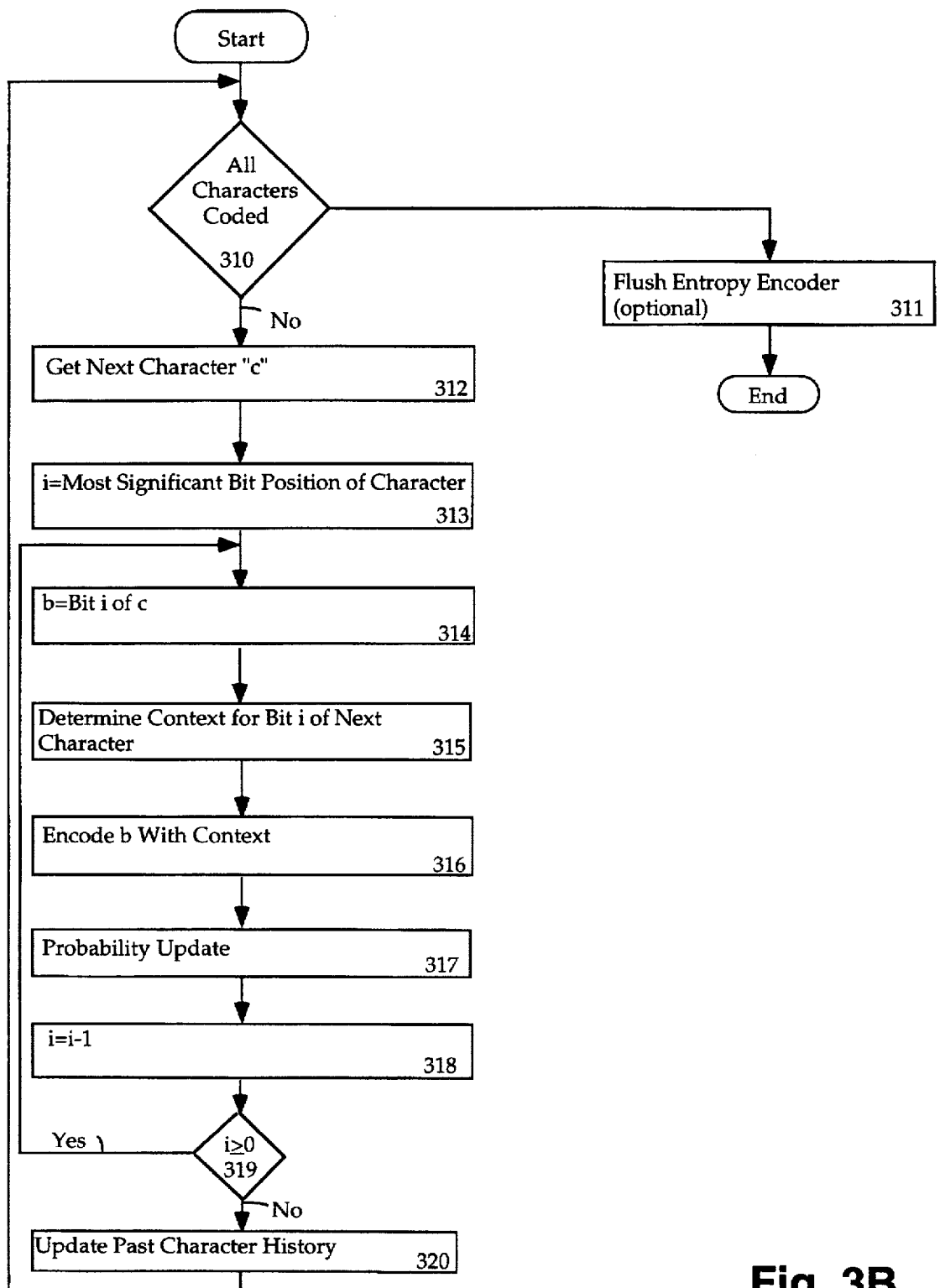
FIG. 3B is a flow chart of one embodiment of the process for encoding characters according to the present invention.

FIG. 3B illustrates one embodiment of the process for encoding characters according to the present invention. Referring to FIG. 3B, the process begins with processing logic testing whether all the characters have been coded (processing block 310). If all the characters have been coded, then the process continues at processing block 311 where processing logic flushes the entropy encoder, after which time the process ends. Flushing of the entropy coder may be performed to reset the entropy coder. Note that this is an optional step and is not required in all implementations.

If all the characters have not been coded, the process continues at processing block 312 where processing logic of the present invention obtains the next character "c". Next, processing logic sets the value of a variable i to the most significant bit position of the character c (processing block 313) and the value of a variable b to bit i of character c (processing block 314).

Then processing logic determines the context for bit i of the next character (processing block 315). Afterwards, processing logic encodes the value of variable b with the context (processing block 316), updates the probability (processing block 317), and then decrements the value of the variable i (processing block 318).

A test then determines whether the value of the variable i is greater than or equal to zero (processing block 319). If the value of the variable i is greater than or equal to zero, the process loops back to processing block 314. If the value of the variable i is not greater than or equal to zero, the process continues at processing block 320 where the past character history is updated by processing logic. After updating the past character history, processing continues to processing block 310.

Figure 3C:
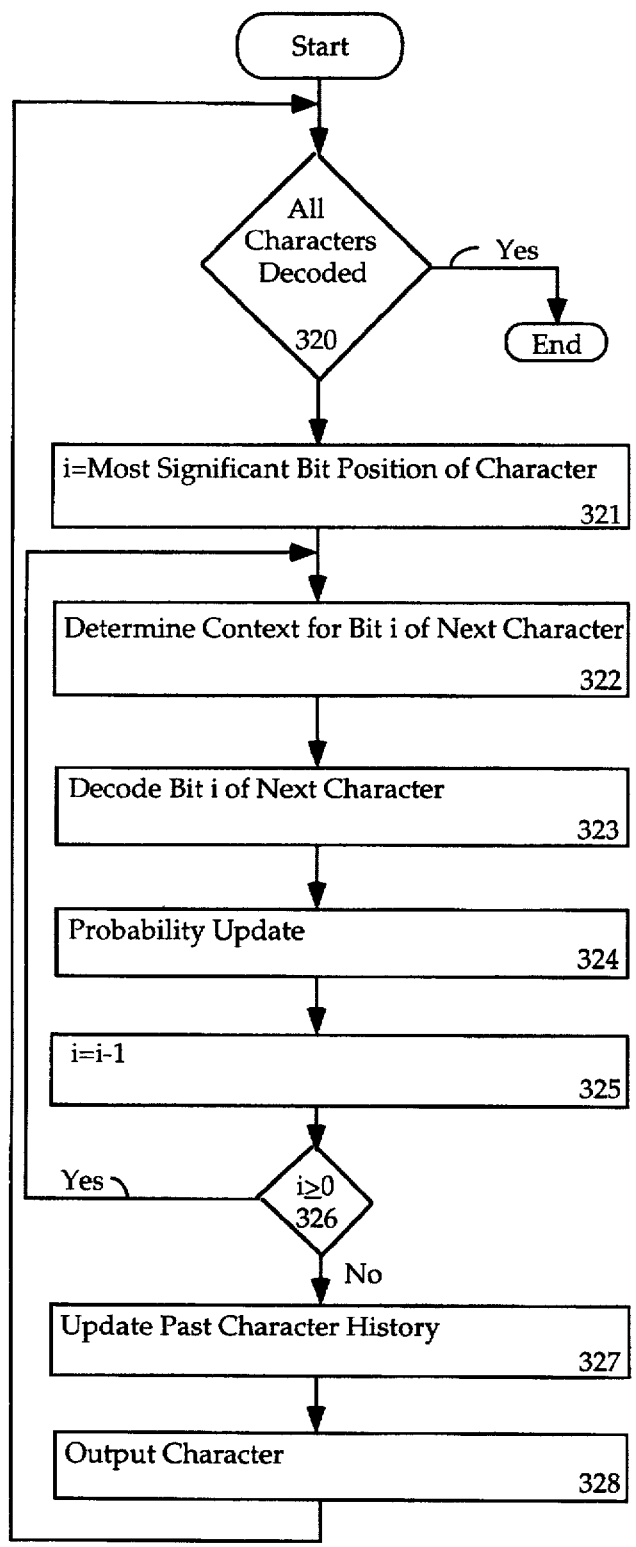
FIG. 3C is a flow chart of one embodiment of the process for decoding characters according to the present invention.

FIG. 3C illustrates one embodiment of the process of decoding characters according to the present invention. Referring to FIG. 3C, the process for decoding characters begins by processing logic testing whether all the characters have been decoded (processing block 320). If all the characters have been decoded, processing ends. If all the characters have not been decoded, the process continues at processing block 321 where processing logic initializes the value of a variable i to the most significant bit position of the character and then determines the context for bit i of the next character (processing block 322). After determining the context for bit i, processing logic decodes bit i of the next character (processing block 323), updates its probability (processing block 324), and decrements the value of the variable i by 1 (processing block 325).

A test then determines if the value of the variable i is greater than or equal to zero (processing block 326). If the value of the variable i is greater than or equal to zero, processing continues to processing block 322. On the other hand, if the value of the variable i is not greater than or equal to zero, the process continues at processing block 327 where processing logic updates the past character history. After updating the past character history, processing logic outputs the character (processing block 328) and processing continues to processing block 320.

Figure 3D:
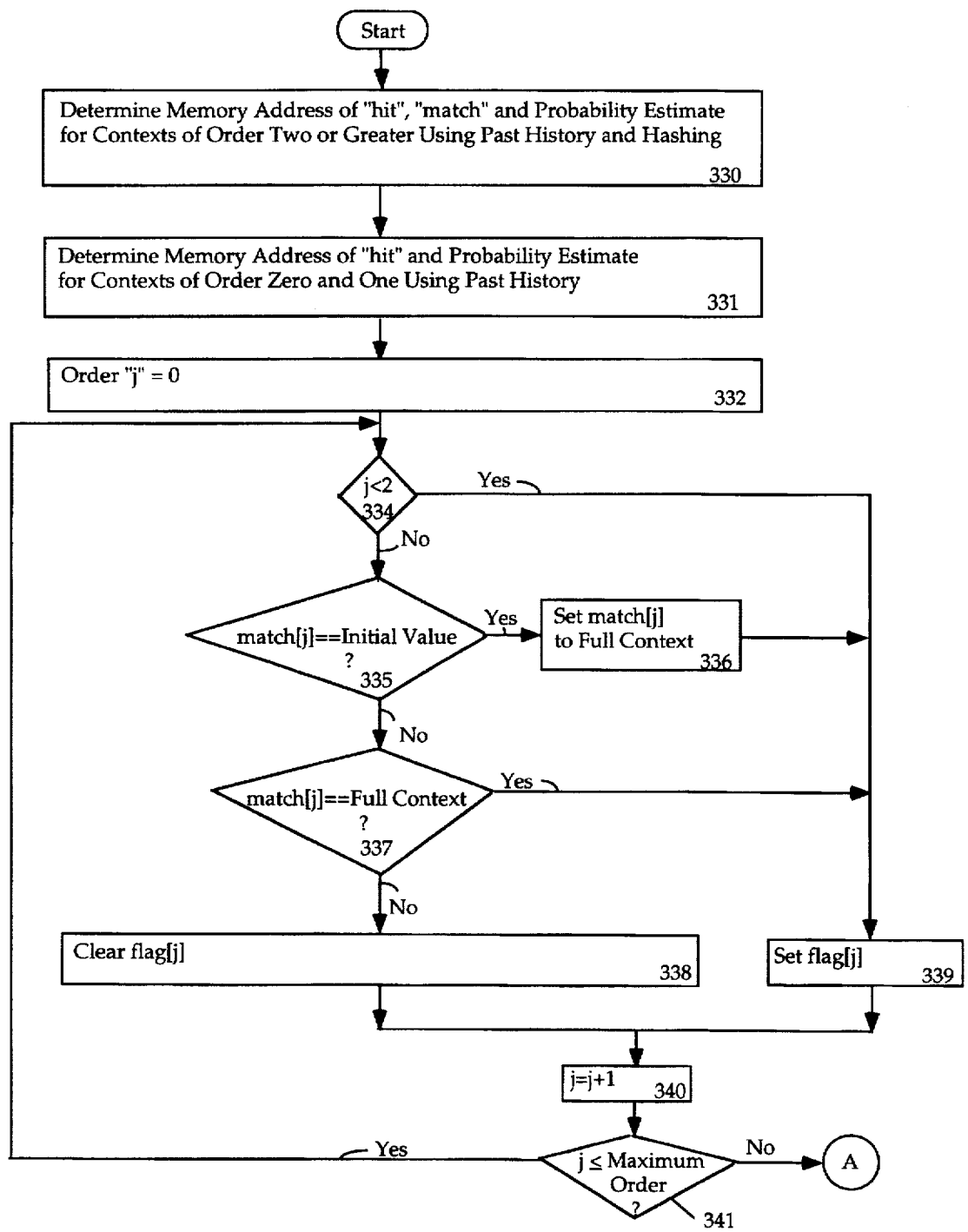
FIG. 3D is a flow chart of one embodiment of the process to determine contexts of particular bits in a character according to the present invention.
Figures 1, 3D:
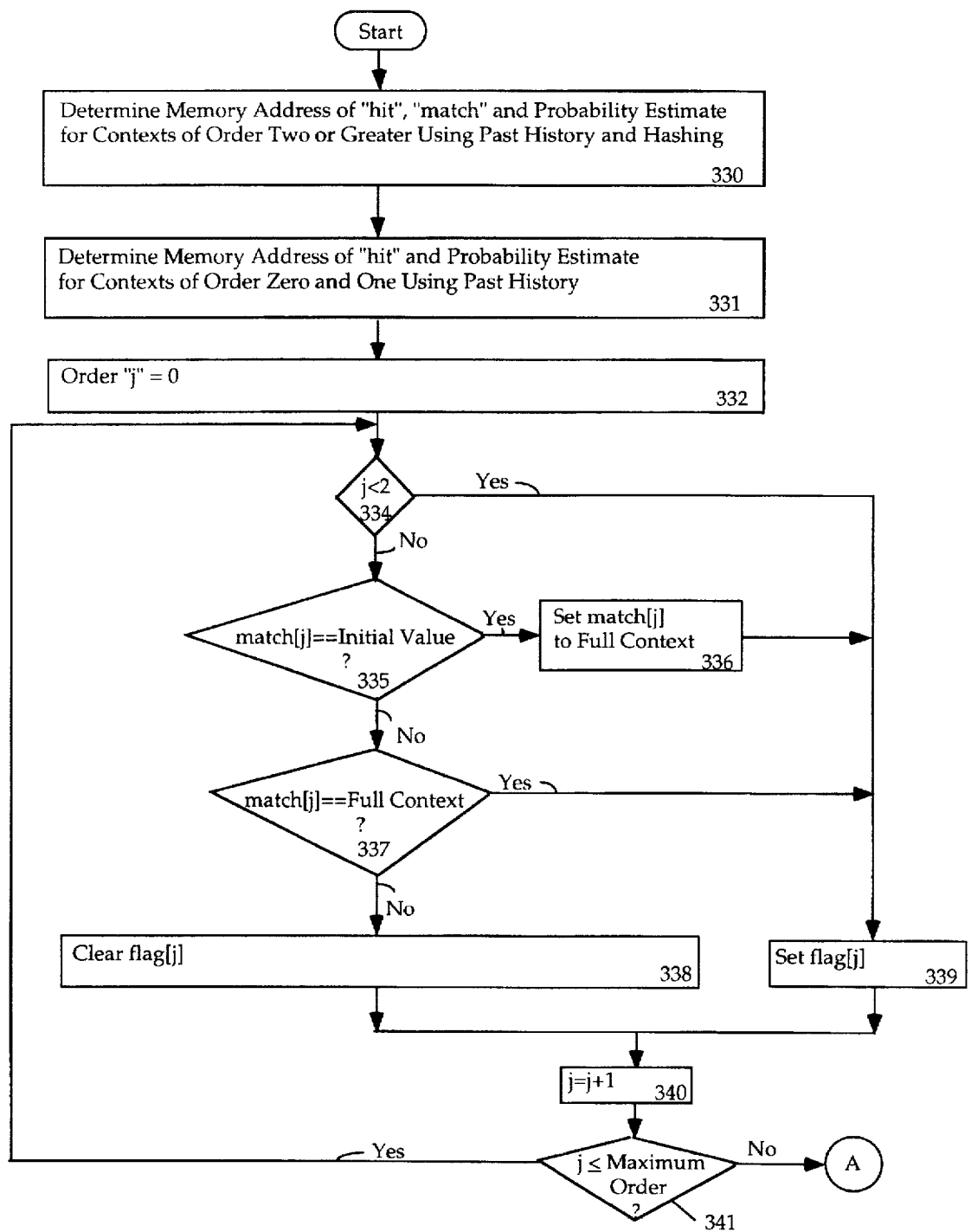
Figures 2, 3D:
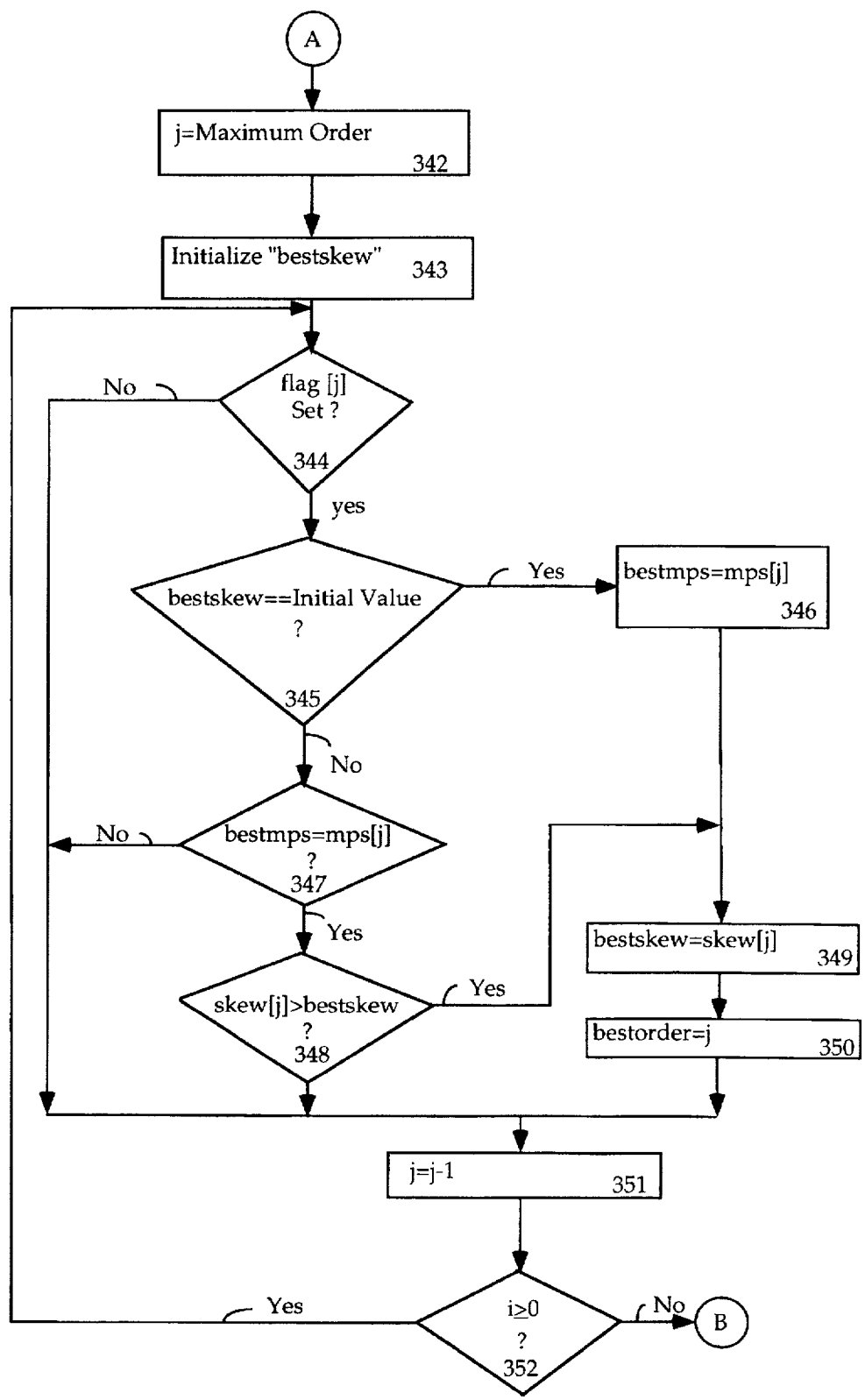
Figures 3, 3D:
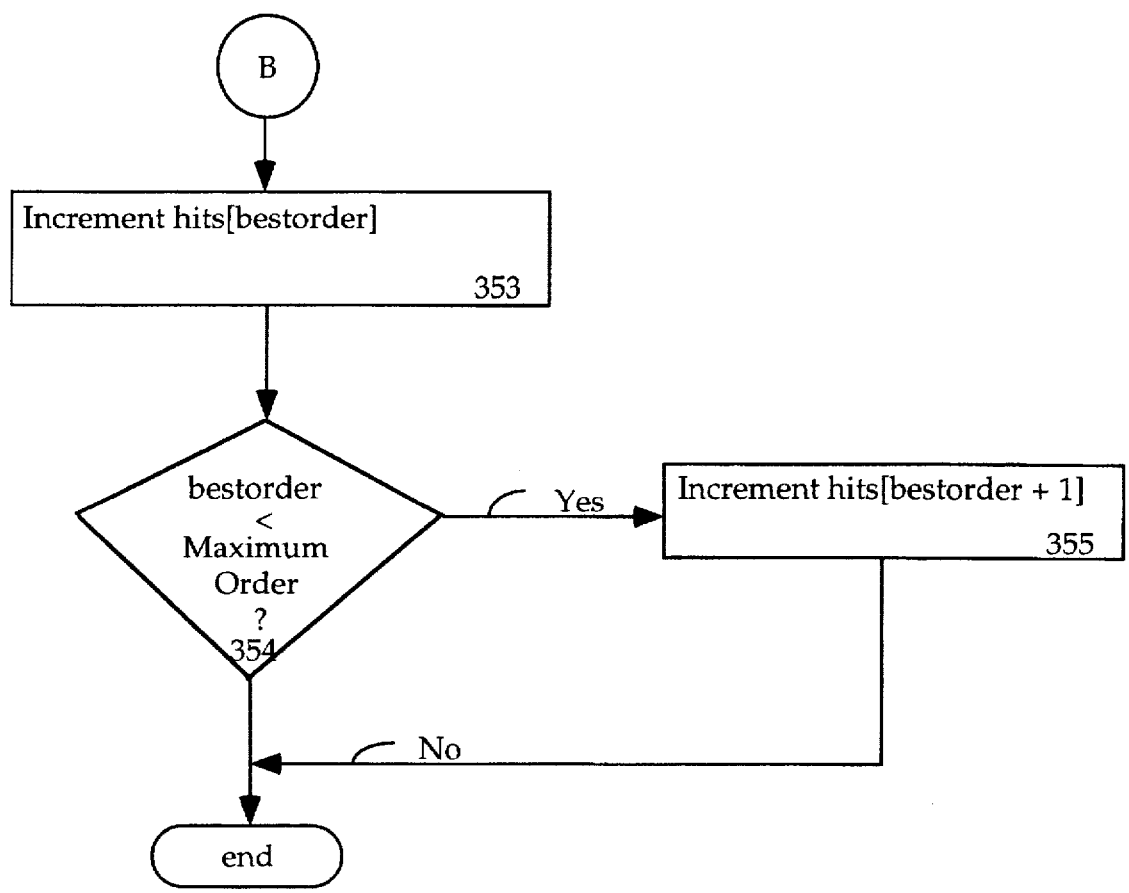

FIG. 3D illustrates the process for determining the context of bit i of the next character. Referring to FIG. 3D, the process begins by processing logic determining the memory address of the "hit", "match" and probability estimate for context of orders two or greater using past history and hashing (processing block 330). Next, processing logic determines the memory address of the "hit" and probability estimate for contexts of order zero and one using past history (processing block 331). After determining the necessary memory addresses, processing logic sets a variable j, which represents the current order, to 0 (processing block 332).

The processing logic then determines whether the order j is less than 2. If the value of the order variable is less than 2, the process continues at processing block 339 where a variable, flag[j], is set. Note that the variable flag[j] indicates that context memory is assigned to order j for the current history. If the order j is less than 2, the process continues at processing block 335 where a test determines whether the match[j] is set to an initial value indicative of a memory location that does not currently store context information (yet might be used later). If the match[j] equals an initial value, processing continues to processing block 336 where processing logic sets the match[j] to the full context. Thereafter, the process continues at processing block 339. If the match[j] is not equal to the initial value, the process continues at processing block 337 where processing logic determines whether the match[j] is set equal to a full context. If the match[j] is set equal to a full context, the process continues at processing block 339. If the match[j] is not set equal to the full context, processing continues to processing block 338 where the flag[j] is cleared.

After clearing or setting the flag, processing logic increments the value of the variable j by 1 (processing block 340) and tests whether the value of the variable j is less than or equal to its maximum order (processing block 341). If the value of the variable j is less than or equal to its maximum order, the process continues at processing block 334. If the value of the variable j is not less than or equal to the maximum order, the process continues at processing block 342 where the value of the variable j is set equal to the maximum order.

After setting the value of variable j to the maximum order, processing logic sets a temporary variable named "bestskew" that is used for comparing skew (processing block 343). The bestskew variable is initially set to −1, 0, or an invalid value. After initializing the bestskew variable, processing logic determines whether the flag[j] is set (processing block 344). If the flag[j] is not set, processing continues at processing block 351. If processing logic determines that the flag[j] is set, processing logic continues to processing block 345 where it determines whether the value of the bestskew variable is equal to an initial value. If the value of the bestskew variable is set to an initial value, the process continues at processing block 346 where processing logic sets a variable bestMPS equal to the MPS[j] (the MPS of order j).

Thereafter, the process continues at processing block 349 where processing logic sets the value of bestskew variable equal to the skew[j] (the probability estimate of variable j) and sets a bestorder variable equal to j (processing block 350). On the other hand, if the value of the bestskew variable is not equal to an initial value, the process continues at processing block 347 where processing logic tests whether the value of the bestMPS variable equals the MPS[j]. If the value of the variable bestMPS is not set to the MPS[j], then the process continues at processing block 351. If the value of the bestMPS variable equals the MPS[j], then processing logic tests whether the skew[j] is greater than the best skew as set forth by the value of the bestskew variable (processing block 348). If the skew[j] is greater than the value of the bestskew variable, the process continues at processing block 349. If the skew[j] is not greater than the value of the bestskew variable, the process continues at processing block 351.

After processing logic determines that the skew[j] is not greater than the value of the bestskew variable or after setting the bestorder variable equal to the maximum order, processing logic decrements of variable j by 1 (processing block 351). Then processing logic tests whether the value of the variable j is greater than or equal to zero (processing block 352). If the value of the variable j is greater than or equal to zero, the process continues at processing block 344. If the value of the variable j is not greater than or equal to zero, the process continues at processing block 353 where the value of the "hits" variable for "bestorder" is incremented by 1. After incrementing the value of hits variable, a test determines whether the value of the bestorder variable is less than the maximum order (processing block 354). If the value of the bestorder variable is less than the maximum order, processing logic increments the value of hits variable, for bestorder+1, by 1 (processing block 355). After incrementing the value of the hits variable or after determining that the value of the bestorder variable is not less than the maximum order, processing ends.

Figure 3E:
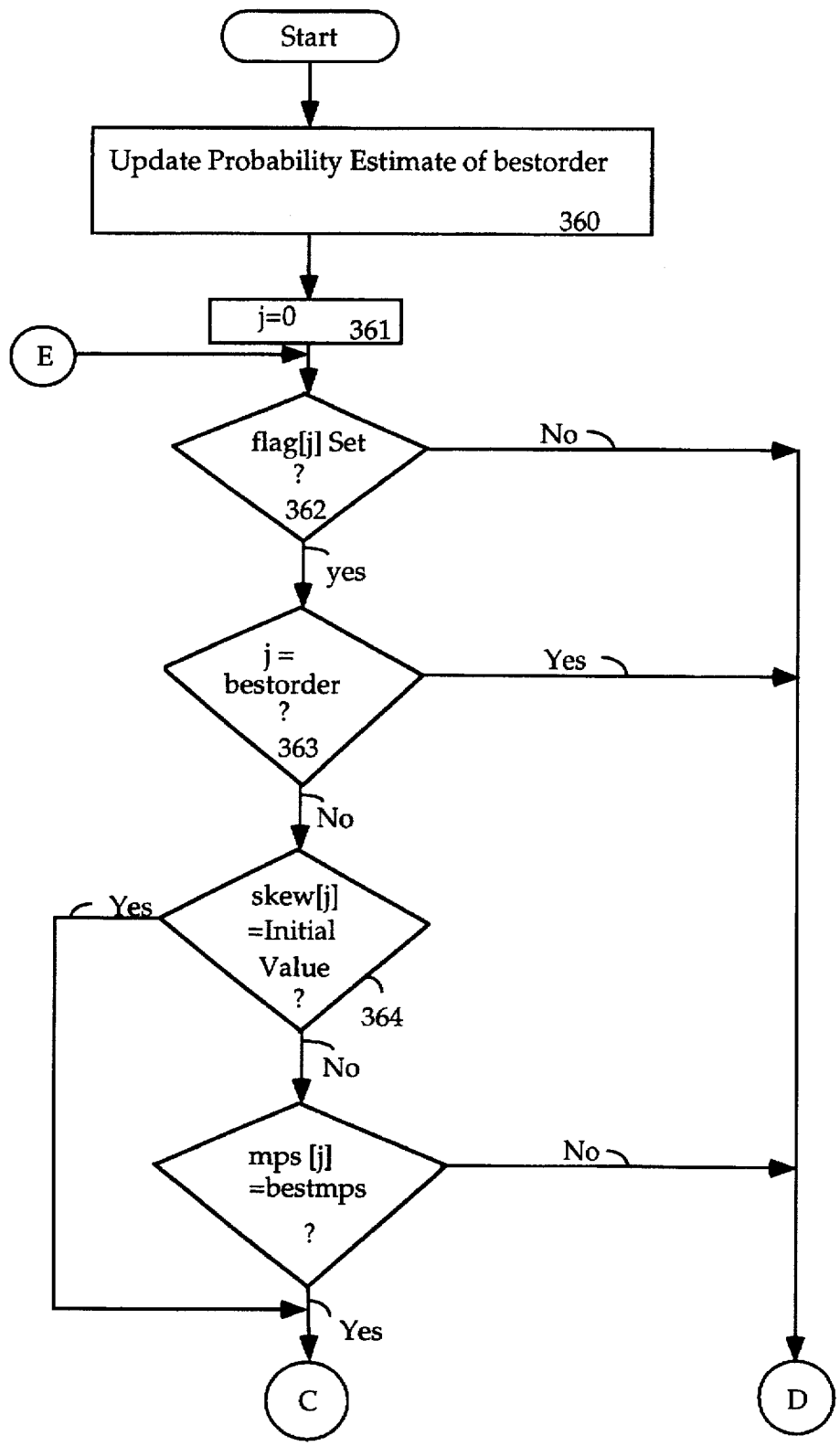
FIG. 3E is a flow chart of one embodiment of the process to update probability estimates according to the present invention.
Figures 1, 3E:
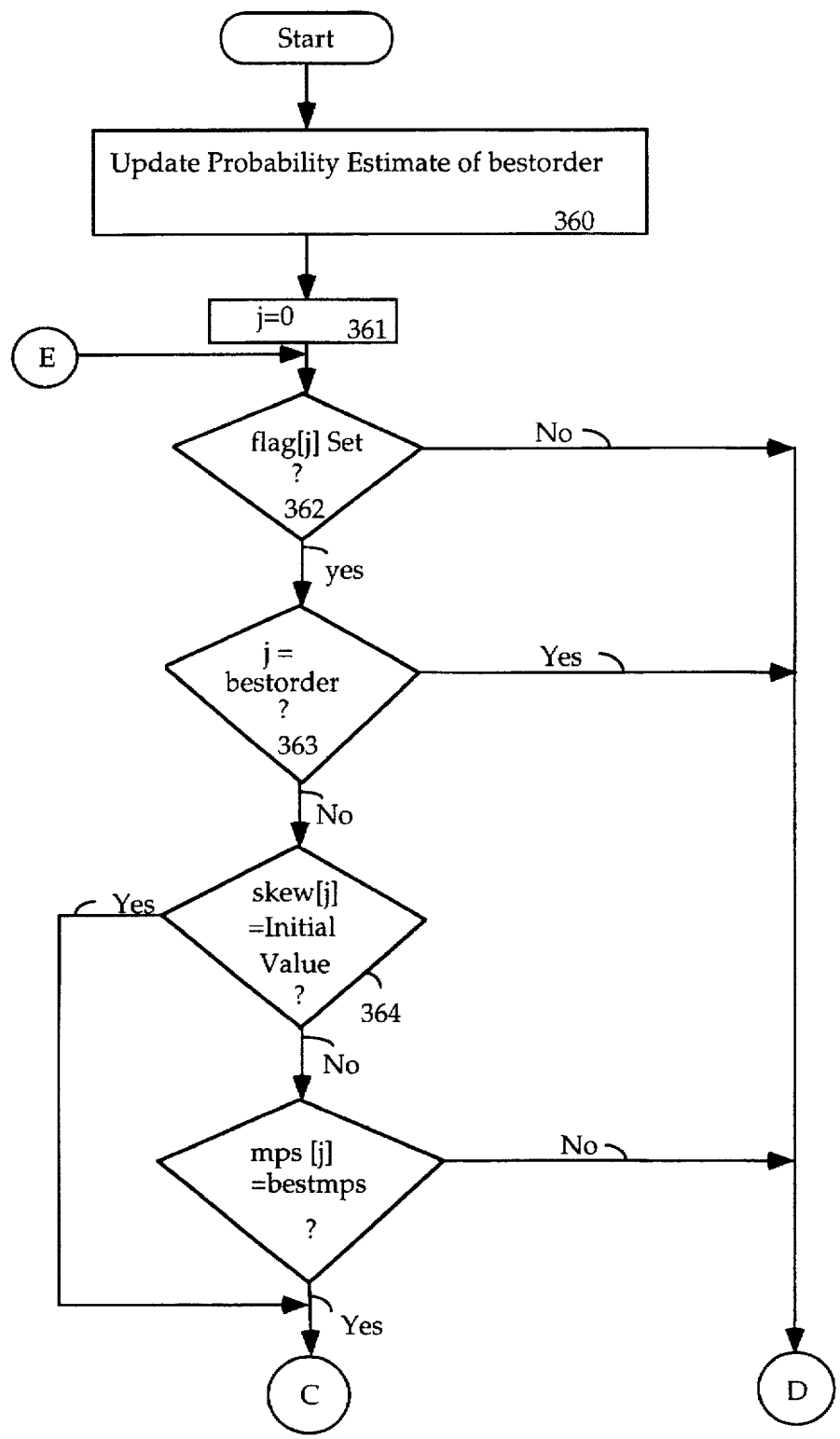
Figures 2, 3E:
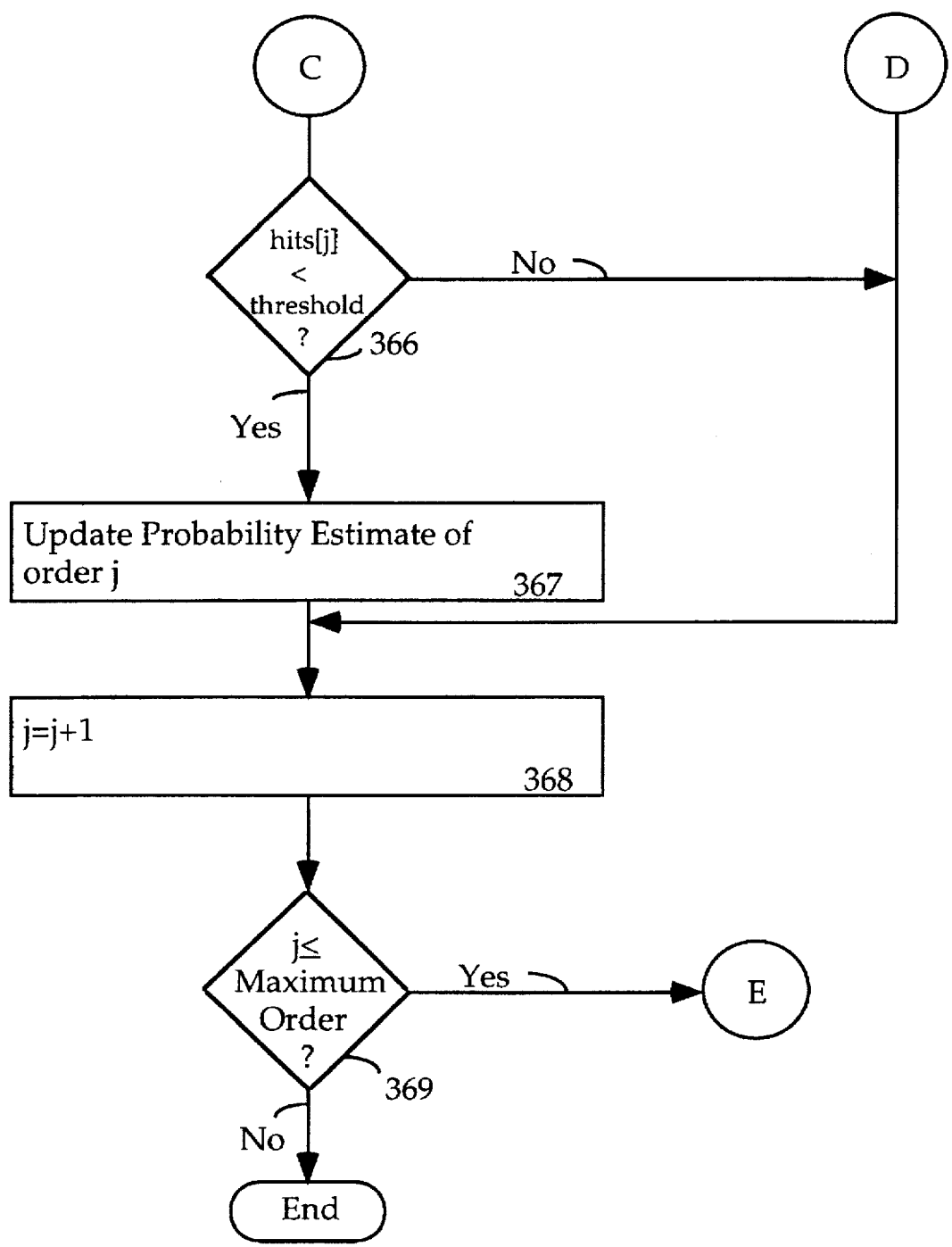

FIG. 3E illustrates the process for updating the probability of a particular context. Referring to FIG. 3E, the process begins by processing logic updating the probability estimate of the best order (processing block 360). Then, processing logic initializes the value of a variable j to zero (processing block 361). Processing logic then determines if the flag [j] is set (processing block 362). If the flag[j] is not set, the process continues at processing block 368. However, if the flag[j] is set, the process continues at processing block 363 where processing logic determines whether the value of the variable j is set equal to the bestorder variable. If the value of the variable j is set equal to the value of the bestorder variable, the process continues at processing block 368. Otherwise, the process continues at processing block 364 where processing logic determines whether skew[j] is set equal to an initial value. If the skew[j] is set equal to an initial value, the process continues at processing block 366. Otherwise, the process continues at processing block 365.

At processing block 365, processing logic determines whether the MPS[j] is set equal to the value of the variable bestMPS. If the MPS[j] is not equal to the value of the bestMPS variable, the process continues at processing block 368. Otherwise, the process continues at processing block 366 where processing logic determines whether the value of hits[j] is less than a predetermined threshold. If the hits[j] is not less than a predetermined threshold, the process continues at processing block 368; otherwise, the process continues at processing block 367 where processing logic updates the probability estimate of order j. Then the process continues at processing block 368 where the value of the variable j is incremented by 1. Then, processing logic determines whether the value of the variable j is less than or equal to the maximum order. If the value of the variable j is less than or equal to the maximum order, the process continues at processing block 362; otherwise, the process ends.

Dynamic Markov Compression (DMC)—An Alternative Context Model

An alternative embodiment of the context model of the present invention (shown in FIG. 1D) comprises a Dynamic Markov Compression (DMC) context model that is dynamically built for the compression of arbitrary data. The DMC context model provides better compression than most (hardware) dictionary methods. Note that this context model may be implemented as the context model shown in FIG. 1D.

Instead of using a set of previous bits as a context, DMC uses a state in a directed graph. An example of such a graph is shown in FIG. 4. "History" is stored in each state, because a given state can only be reached with certain sequences of bits. A graph can be started with 8 states representing bit position or with a set of states that capture some number of related previous bits and the bit position. During the coding process, some states are allowed to be split. However, after splitting states, some states have additional "history" or "memory" because a more specific sequence is required to reach them. For instance, some states only have one bit of history while other states may have many bits of history. Ideally, the graph grows to accurately predict the current data stream. The growth of the graph depends on the data encoded.

At each position in the graph, a count is kept of the number of one bits and zero bits that have occurred in the state. These are used both to estimate the probability of a one bit the next time the state is entered and to determine if a state should be split into two distinct states. Each state also contains two pointers to the states used after a one bit and after a zero bit.

Referring to FIG. 4, the arcs are labeled with the uncompressed bit (0 or 1) and the count of previous bits which occurred in the state. If encoding is started in the left most state, State 0, the state in the graph indicates the bit position modulo 4. As shown, there is no distinction for the value of previous bits (both zero and one bits lead to the same next state). Examination of the counts reveals that in State 0 a zero bit almost always occurs so good compression can be obtained. In State 3, zero bits and one bits are equally likely.

An example state memory associated with the state diagram in FIG. 4 is illustrated in Table 2 below:

TABLE 2

| present state | "0" count | Next state on "0" | "1" count | Next state on "1" |
|---|---|---|---|---|
| 0 | 99 | 1 | 1 | 1 |
| 1 | 60 | 2 | 40 | 2 |
| 2 | 60 | 3 | 40 | 3 |
| 3 | 50 | 0 | 50 | 0 |
| 4 | | | | |
| 5 | Unused states — available for splitting | | | |
| 6 | | | | |

The encoding procedure is as follows:
1. Determine the next bit (one or zero) in the uncompressed file.
2. In order to code a "one" binary decision use probability determined by the number_of_ones/(number_of_ones+number_of_zeros). In order to code a zero, code one minus this probability.
3. Update the count for the bit which occurred.
4. Change to the next state for the bit which occurred.

A block diagram implementing this procedure is shown in FIG. 5. Referring to FIG. 5, a state register 501 maintains the current state. The state in state register 501 is provided by multiplexor (MUX) 502 which receives the next states from memory 504 for when the current bit is a 1 or a 0. Using the current bit as a selection signal to MUX 502, MUX 502 provides one of the two states to state register 501.

The current 0 and 1 counts for the state specified by state register 501 are sent from memory 504 to counting logic 503 which increments either the 0 or 1 count based on the value of the current bit. After incrementing one of the counts, they are stored back into memory 504.

The 0 and 1 counts from memory 504 are also sent to logic 505 (prior to updating) which converts the counts to a code. In one embodiment, logic 505 comprises a look-up table (LUT). The output of logic 505 comprises a code and MPS which are received by a parallel coder 506 that provides the compressed bit stream.

Because the decoder knows the counts before they are updated, it can determine the encoded bit from the compressed bit stream. Then the decoder can update the counts and select the same next state as the encoder.

Adapting the Context Model

To provide the best possible compression, the graph is expanded by selectively splitting a state into two states. This is referred to below as adaptation. In one embodiment, the probability estimation counts are used to decide when to increase the size of the graph. For this reason, it is important to have true counts rather than just pseudo-random estimates.

After a bit has been encoded (step 2 above) and before updating the count (step 3 above), a decision is made about whether to split the state about to be entered. In one embodiment, there are two conditions which must exist before a state is split: the count of the branch about to be taken is above a first threshold, and the state about to be entered has been entered using branches other than the current branch more times than a second threshold. When both of these conditions are met, the state about to be entered is split. The branch which was going to the old state is changed and a new state is created and entered. All branches from other states continue to point to the old state.

The thresholds used in the two splitting conditions are referred to herein as MINcnt1 and MINcnt2. The counts for the branches are divided between the new state and the old state in proportion to the count on the current branch and the total uses of the old state. The new state uses the same next states (for zero and one bits) as the old state did.

This state splitting is illustrated in FIGS. 6A and 6B. In FIG. 6A, several states are shown along with some of the branches. Branches are labeled with the input bit and the number of times the branch has been used. The branch from State 4 to State 5 labeled "1,6" means when a one bit is the input State 5 will be the next state and this has happened 6 times. Every state has two branches, but branches that are not important for this example have been omitted from the figure (for example the branch for a zero bit in State 1).

Table 3 below illustrates a state memory associated with FIG. 6A. Note that the locations with dashes do contain values, which have been omitted to avoid obscuring the following example. State 120 is the unused state that is available for splitting.

TABLE 3

| present state | "0" count | Next state on "0" | "1" count | Next state on "1" |
| --- | --- | --- | --- | --- |
| 1 | — | — | 8 | 4 |
| 2 | — | — | 2 | 4 |
| 3 | — | — | 2 | 4 |
| 4 | 6 | 6 | 6 | 5 |
| 5 | — | -MORE STATES- | | — |
| 6 | — | — | — | — |
| . | | | | |
| . | | | | |
| . | | | | |
| 120 | | | | |
| 121 | | | | |
| . | | | | |
| . | | | | |
| . | | | | |

Suppose for this illustration MINcnt1 equals 5 and MINcnt2 equals 3. If coding is currently being performed in State 1 and a one bit occurs then the next state would normally be State 4. First a check is made to see if State 4 should be split. One condition is the branch about to be taken has been used more than MINcnt1 times. Since MINcnt1 is less than 8 this is true in the example. The second condition is that State 4 has been entered more than MINcnt2 times from other states. This is determined by adding the number of times State 4 has been left (6+6) and subtracting the number of times the active branch has been used, 8. Since MINcnt2 is three this condition is also met.

Because of the split decision, State 1 with a 1 bit will now go to State 120 rather than State 4. In the example the branch has been used 8 times and the next state 12 times so two thirds of the counts go to the new state. The updated state machine is shown in FIG. 6B. After splitting the state the count for State 1 is updated, and the current state becomes State 120.

Table 4 illustrates the state memory associated with FIG. 6B. Note that the asterisk indicates table entries that have been changed from Table 3 due to the state split. As in Table 3, the dashes indicate that a number is stored in the table entry but has been omitted to avoid obscuring the example. The new state is state 120 because that is the next available state.

TABLE 4

| present state | "0" count | Next state on "0" | "1" count | Next state on "1" |
| --- | --- | --- | --- | --- |
| 1 | — | — | 8 | 120* |
| 2 | — | — | 2 | 4 |
| 3 | — | — | 2 | 4 |
| 4 | 2* | 6 | 2* | 5 |
| 5 | — | — | — | — |
| 6 | — | — | — | — |
| . | | | | |
| . | | | | |
| . | | | | |
| 120 | 4* | 6* | 4* | 5* |
| 121 | | | | |
| . | | | | |
| . | | | | |
| . | | | | |

Note that in the present invention, the states are stored in specific memory banks as described in more detail below. This is different than in the prior art where one single memory stores all of the states. Because states are stored in specific memory banks, the amount of memory that a particular state has available is limited. In the present invention, the determination of whether to split a state is also based on the available space in the memory bank of the state. This is described in more detail below.

A summary of steps for implementing a decision of whether or not to split and to perform a split are as follows:

1. If no space in current memory bank or count for current branch is too small or sum of branches leaving a next state minus the current branch count is too small, then a split of the next state is not permitted.

2. If the split is allowed, copy the destinations of the next state to a new state.

3. Change the destination of the current branch to the new state.

4. Assign counts for the new state proportional to the branch count, i.e. new_count_0=branch_cnt*next_cnt0/ (next_cnt0+next_cnt1).

5. Change the counts for the next state to the difference from what they were and the counts assigned to the new state.

It is advantageous to split a state if doing so improves compression. However, making that determination is difficult and can require storage and examination of much data. As disclosed herein, a state is split if two or more paths are going through the same state and both are being used frequently. The compression cost of splitting states includes slowing down the probability estimation and using up all available states before other states could split. The thresholds are selected to create a balance between slowing down probability estimation, using up all available states and improving compression, although many values give close to the same results.

Memory Requirements and Banking

In the present invention, each state has four data items: a count of both zero bits and one bits from the state and a pointer to the next state for both a zero input bit and a one input bit. Improved compression occurs when fixed-point arithmetic is used with at least two binary decimal places (counts are kept after splitting to an accuracy of ¼). Use of less precise counts leads to poor probability estimation when states are split. In one embodiment, 16 bits are used for the count of both zero and one (5-bit integer count and 2-bit fractional count). Also, each context may have two pointers capable of indexing the total number of states allowed.

In one embodiment, the graph could initially start with 8 states, one for each bit position in a byte (MSB to LSB). In this case, the entire state memory can be split into 8 banks, which are used cyclically. A state is only split if more memory exists in the same bank. Each state uses 3 bits (corresponding to the 8 banks) less for the pointers than the prior art DMC because of the implicit address given by the bit position.

The use of implicit addressing can be extended by further subdividing the memory into banks according to the previous bits. For example, one of 64 banks could be selected based on the 3 previous bits and the bit position. As long as the initial graph contains the correct states (e.g., state which are in a bank when they have the same previous bits and point to the bank for corresponding inputs), the division is maintained when splitting states. The new bank is now selected by combining the bit-position counter, the previous bits from a shift register, and the value stored in the current state.

Because more states may split initially in one bank than a second, a counter (or memory) for each bank maintains a record of the next state to be used in that bank. Banking can result in decreased compression because one bank may not need all the memory assigned, while another bank cannot split as much as it would in an unconstrained system.

Figure 10:
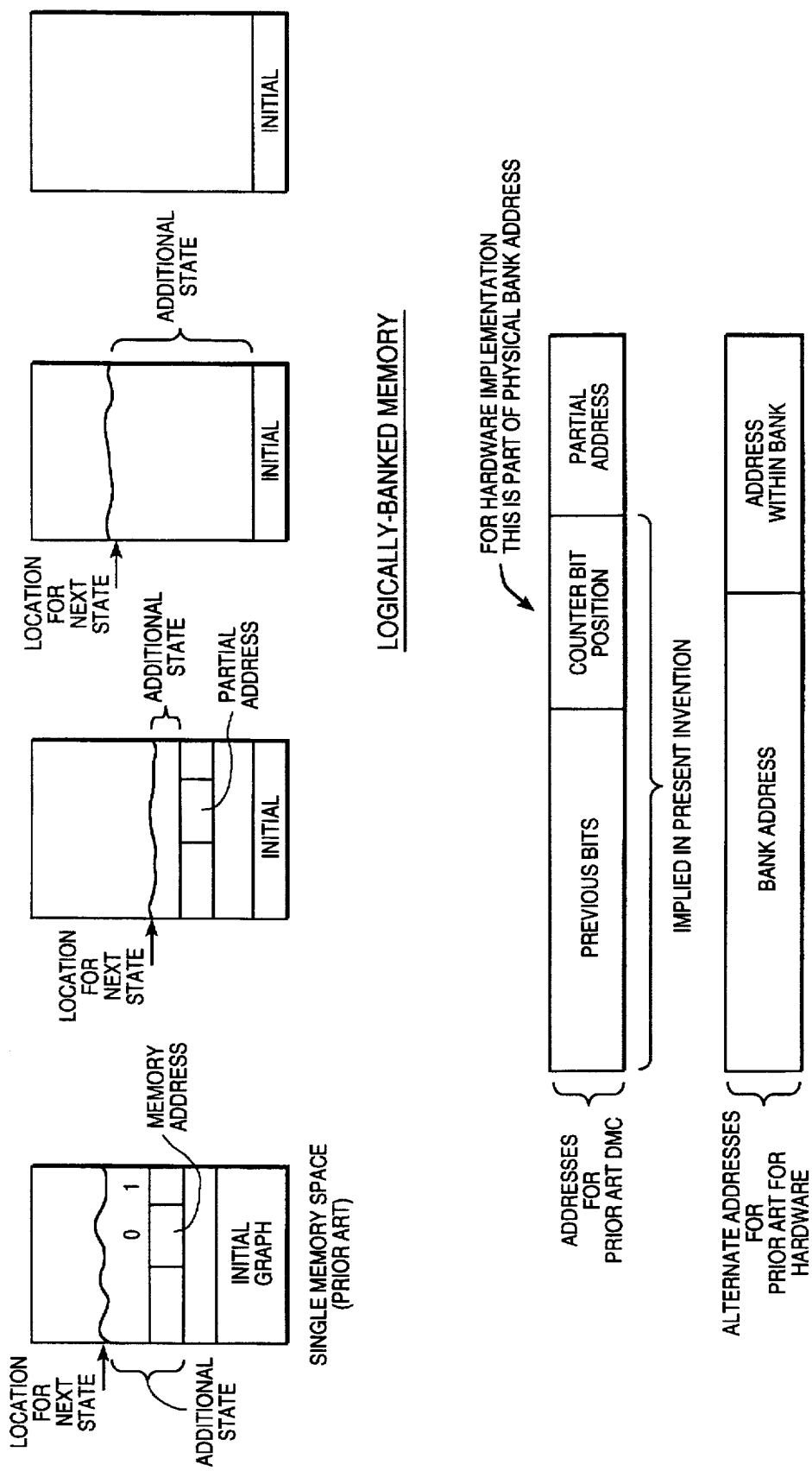
FIG. 10 illustrates memory banking for one embodiment of the present invention.

FIG. 10 illustrates differences between the DMC context model of the prior art and the present invention. Referring to FIG. 10, the DMC context model of the prior art uses a single "infinite" memory resource that stores only the initial graph in the beginning. Later, as states are split, additional states that are created are stored in the memory. Each state in the memory includes memory addresses to locations in the memory for the next state (depending on whether the next state is a (1 or 0)).

The present invention, on the other hand, may use logically-banked memory. In the present invention, only a partial address(es) needs to be stored with each state. This is because the previous bits and counter bit position that must be stored in the prior art DMC implementations are automatically determined because of the use of separate banks. Thus, while the prior art DMC algorithm requires the equivalent of an entire bank address and the address within the bank to be stored in memory, the present invention only stores the address within the bank (for the two states and the counts).

Note that physically separate banks allow for parallel operation. In hardware, the counter bit position is part of the bank address to ensure that different physical banks are accessible. Note that each physical bank may include one or more logical banks.

For a hardware implementation, the memory requirements with banking are $$2M\log\frac{M}{B} + B\log\frac{M}{B} + 2MW$$

where B is the number of banks in use, M is the total number of states in all banks, W is the width in bits of memory used for counters, and all logarithms are base 2. Note that this assumes an equal number of states are available in each bank. If the compression system is used on data with known properties, it is possible to use a different number of states in each bank. In addition, even if it is known that bit-position 7 is always zero (as when ASCII is being coded), multiple states are still needed in bank 7 to carry history information from bank six to bank zero.

While in terms of number of contexts, there it is always an advantage to using an adaptive model, there is an additional cost of storing the structure of the model. In one embodiment, there are two integer counts in every context and two pointers to the next context. Each context uses 26+2 $\log_2$(number of contexts) bits, without banking. In one embodiment, the memory usage is between 64 kbits and 1 Mbit (e.g., 768 kbits of on-chip memory).

Rescaling Counters

In one embodiment, to improve compression and prevent probability estimation from suffering, all counts are maintained as fixed point numbers with 2 bits to the right of the binary point.

Even with the added overhead of 2 extra bits per counter, it is possible to use a smaller number of bits to store the counts for each state than prior art DMC. In one embodiment, counts may be rescaled at some maximum value, such as 64 or 32. Rescaling counts destroys the splitting rules for the original DMC algorithm, but higher counts are not reached until most of the splitting has been done. Thus, instead of the 32 bits used for "unlimited" counts, it is possible to use only 14 (=2*log(32)+2*2). In one embodiment, rescaling can be done by a shift of both the one and zero counts when either reaches a maximum value.

Reducing the precision of counter can increase the bitrate and decrease the memory cost.

Probability Estimation Table

Each context uses memory for choosing the next state and for tracking the number of uses of each branch. Banking reduces the next state memory cost.

In order to reduce the memory required for probability estimates, one table may be used with counts in it and each context would only have a pointer into the table. It is not necessary to keep all possible counts in the table. For example, only counts which sum to less than 32 might be kept. In one embodiment, the table does not contain the fractional part of the count, especially when the counts are larger. A table for estimation also has an advantage because it will not be necessary to divide one count by the sum to determine the probability estimate. Thus, division can be determined in advance and the table can contain the proper code to use.

In one embodiment, 16 or 32 different codes may be used by the binary entropy coder. Because not all possible counts exist in the table, the next state is provided in the table rather than using the counter to determine the next state. A portion of a possible table appears in Table 5.

This embodiment requires memory for storage of the table entries or hard-wired logic. However, the amount added for such tables is much less than the memory saved by using only one index in each state of the context model rather than two large counters in each state. The counts are still necessary for determining if a node should be split and for selecting the counts after splitting.

TABLE 5

| Estimation Table | | | | | |
|---|---|---|---|---|---|
| Index | MPS Count | LPS Count | Code | Next on MPS | Next on LPS |
| 0 | 1 | 1 | R2(0) | 1 | 1 |
| 1 | 2 | 1 | R3(1) | 3 | 4 |

TABLE 5-continued

Estimation Table

| Index | MPS Count | LPS Count | Code | Next on MPS | Next on LPS |
|---|---|---|---|---|---|
| 2 | 2 | 2 | R2(0) | 4 | 4 |
| 3 | 3 | 1 | R2(2) | 6 | 7 |
| 4 | 3 | 2 | R2(1) | 7 | 8 |
| 5 | 3 | 3 | R2(0) | 8 | 8 |
| 6 | 4 | 1 | R2(3) | 10 | 11 |
| ... | ... | ... | ... | ... | ... |
| 2015 | 63 | 63 | R2(0) | 559 | 559 |

In Table 5C, the Code entries contain R-codes that are adaptive codes which include Golomb run length codes (i.e., R2(k) codes). For more information on these R-codes, see U.S. Pat. No. 5,381,145, entitled "Method and Apparatus for Parallel Decoding and Encoding of Data", issued Jan. 10, 1995.

Simplified State Splitting Decision

If a single table is used to provide both splitting rules and probability estimates, it conceivably might have as few as 512 entries. In this case, a state would only need 9 bits instead of the current 14 used for counts. However, since each context also requires two pointers to the next possible states the true memory reduction is close to 10% and the loss of compression does not justify the memory savings. The only reason to use a single table for probability estimation and splitting is if the required computation can be reduced.

As discussed above, when a state is split, the new count is determined by a proportional scaling new0=branch*cnt0/(cnt0+cnt1). The remaining new values can be computed by subtraction. A single probability estimation table can be designed containing split rules and estimates. A probability estimation table is created using MPS and LPS counts. States are split if the current branch is used more than a threshold number of times. The new estimation state for the new context and the split context is given by rescaling the counts by ½.

The estimation table has several pieces of information for each entry: the run code to use for the context (3–6 bits), the next state on a LPS, the next state on an MPS, a swap on LPS bit, a split OK on LPS bit, a split OK on MPS bit, and next states for splits on LPS and MPS. The two next states for use on splits could be reduced to one state to be used on either an MPS or LPS. There is an advantage for using prior information about bit position, but this benefit slowly disappears as the number of bits used is increased. In one embodiment, individual counts of ones and zeros are not kept, and a table lookup for splitting states is used.

The adaptive context model of the present invention obtains performance which cannot be obtained with a fixed-order Markov context model. For a hardware compression system to be useful it needs to obtain at least 2:1 compression on some large set of files. Without an adaptive context model, 2:1 compression is often not obtained. With more contexts eventually a fixed-order context model cannot estimate probabilities accurately with the finite amount of data available. Thus, because the present invention is not so limited, the present invention offers advantages over the prior art.

Random Access and Parallel Operation

When adaptive lossless compression is performed on a file, it is generally necessary to decompress the entire file to decompress the last byte in the file (there is no random access). However, in a computer system, the operating system calls to access disks or flash memory typically assume some form of random access is available. An application programmer may seek to a specific byte, but the operating system (or device driver) will seek to the correct block and read the entire block. Random access can be provided by compressing portions of a file independently. If the size of the piece of the file is too small, there is insufficient data to provide accurate probability estimates. This insufficient adaptation causes a significant compression decrease. Larger independently compressed blocks require more data to be compressed and decompressed together causing greater latency for an access.

The size of an independent piece can be chosen based on the physical device using compression.

Independent blocks can be compressed and decompressed independently by parallel hardware. If large buffers are provided, or the independent blocks are small enough, this could provide a decrease in the amount of time required to decompress long files. However, the separate blocks must still be correctly organized and sent to the storage device. Also, this type of parallel operation will not decrease the latency sufficiently if block sizes are too large.

Because of a desire for random access to compressed data, the encoders may be reset periodically. Each block essentially becomes a separate file in this case and with the smaller data size probability estimation is not as effective and compression is not as good. The block size used may depend on the storage device or application. Therefore, in one embodiment, block sizes from 1 KB to 64 KB may be used. At below 1 KB, compression is substantially decreased.

In one embodiment, 7-bit counters and 8 logical banks are used with 8 KB blocks.

The binary compressors such as those described herein can compress faster and have lower latency with parallel hardware. Several binary compressors may be used and share statistics. Each compressor may work on a different bit position of a small block. In such a case, the first character in each small block is coded with out any history bits. The different bit positions access different banks of physical memory. These may correspond partially to the logical memory bank division discussed above. Sharing statistics allows good probability estimates to be obtained with these smaller blocks. The only compression loss is the prediction of the first character in each small block.

With parallel hardware each coder will conceptually work on a different piece of the data. The statistics can be accumulated over a large block. If each coder is 8 bytes apart, then every 8 bytes a bit must be encoded without knowing the previous bit and the second bit can only use one bit of history, etc. With very small buffers (e.g., 4 bytes), there is a loss in compression when more contexts are used. Presumably, this is because the context model attempts to adapt to longer strings and because of the resetting these contexts are used infrequently. Resetting the history buffer clearly has an impact on compression.

Parallel Implementation of Arbitrary Data Compression

The present invention provides for compression of arbitrary data using a parallel entropy coder. The following discussion describes two methods of sequencing the input data through parallel context models.

Figure 8:
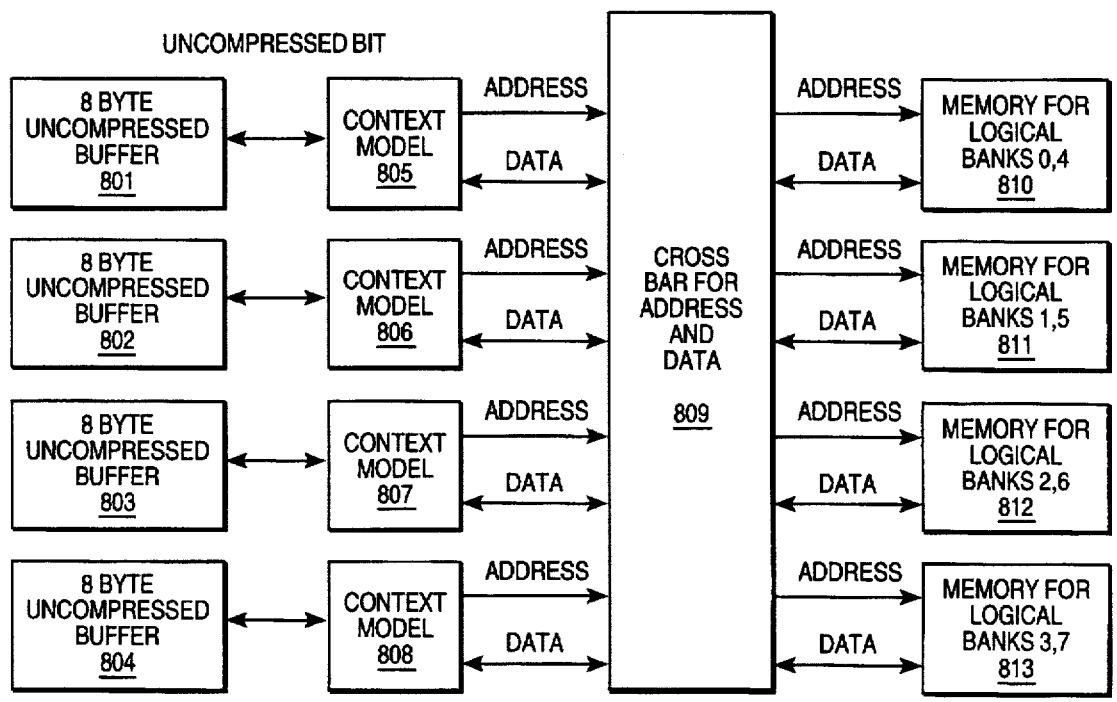
FIG. 8 is a block diagram of one embodiment of a parallel coder implementation.

One embodiment uses four parallel context models (805–808) on one input stream as shown in FIG. 8. Each coder has it's own buffer, buffers 801–804, which is processed in order from beginning to end. In one embodiment, each of buffers 801–804 comprises an 8 byte buffer. The coders are staggered so that they always access different memory banks. When processing is complete, the four buffers can be switched. The access pattern is shown in Table 6 below. Context model 805 always works on the first 8 bytes out of 32; context model 806 works on the next eight bytes and so on. Table 6 shows the bit being coded by each context model over time. Each entry in Table 6 contains three numbers: the byte, the bit and the bank.

TABLE 6

| Time | 0 | 1 | 2 | 3 | 4 | 5 | 6 | 7 | 8 | 9 | 10 |
|---|---|---|---|---|---|---|---|---|---|---|---|
| CM 0 | 0,0,0* | 0,1,1 | 0,2,2 | 0,3,3 | 0,4,0 | 0,5,1 | 0,6,2 | 0,7,3 | 1,0,0 | 1,1,1 | 1,2,2 |
| CM 1 | idle | 8,0,0 | 8,1,1 | 8,2,2 | 8,3,3 | 8,4,0 | 8,5,1 | 8,6,2 | 8,7,3 | 8,8,0 | 8,9,1 |
| CM 2 | idle | idle | 16,0,0 | 16,1,1 | 16,2,2 | 16,3,3 | 16,4,0 | 16,5,1 | 16,6,2 | 16,7,3 | 16,8,4 |
| CM 3 | idle | idle | idle | 24,0,0 | 24,1,1 | 24,2,2 | 24,3,3 | 24,4,0 | 24,5,1 | 24,6,2 | 24,7,3 |

In order to check for the need to split states, each context model also examines data in the memory bank following the current bit. This happens in lock-step. Context model 805 accesses Bank 0 to get information on the current state, while context model 806 accesses Bank 1, etc. Then, context model 805 accesses information in Bank 1 to get split information about the next state. In one embodiment, the switching to allow the context models to access other memory banks is performed by a crossbar using address and data.

Figure 9:
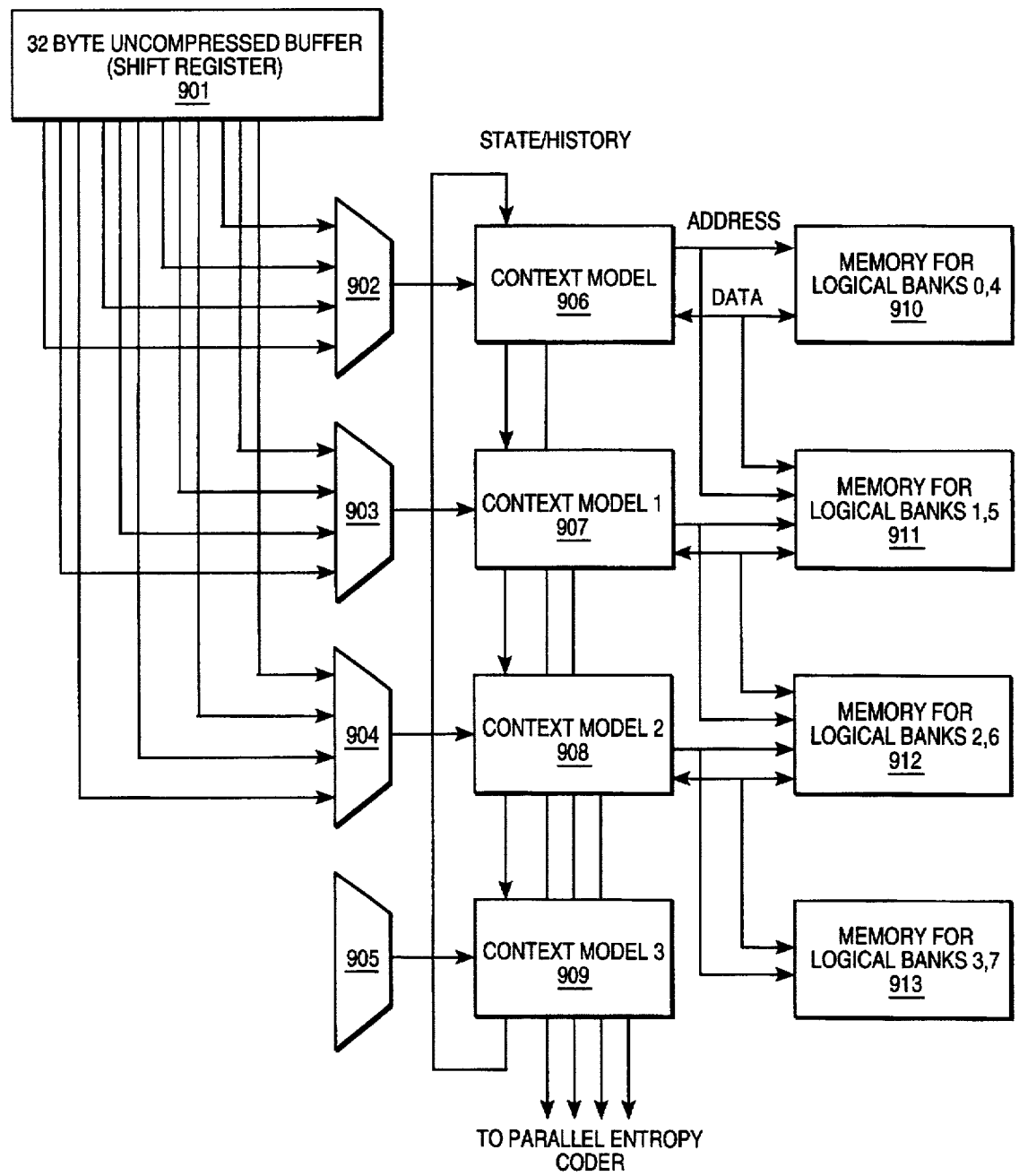
FIG. 9 is a block diagram of an alternative embodiment of a parallel coder implementation.

In an alternate embodiment, such as shown in FIG. 9, there is one 32 byte buffer 901. Buffer 901 may comprise a shift register. Context model 906 accesses either byte 0 bit 0, or byte 8 bit 0, or byte 16 bit 0, or byte 24 bit 0. Context model 907 accesses one of the bit 1s of the same four bytes, and so on. After each context model reads the appropriate bit, the shift register of buffer 901 can be shifted by four bits. The access pattern is in Table 7. In this case, the primary memory bank is always the Bank 0 for context model 906 and Bank 1 for context model 907. Of course, the context models also access the following bank for splitting information. Table 7 is also different because the context models have been staggered by two positions at startup. This is probably more realistic because there may be pipeline delays receiving information from memory or from the parallel entropy coder (e.g., a high-speed parallel coder). Even longer delays could be added. The current state is passed among the context models. (Note for this embodiment of the context model, instead of passing current state in a cycle (0,1,2,3,0, ...), history information is passed.

We claim:

1. An apparatus for compressing an input data stream comprising:
   a hardware context model operable to model individual bits of arbitrary types of data, wherein the arbitrary types of data comprises data of a first bit length and a second bit length not equal to the first bit length, said model using various orders to generate a context and a binary decision for each bit in input data stream and further comprising context splitting logic that adaptively activates contexts of orders higher than those active while coding of the input data occurs;
   a binary entropy coder coupled to the model to to generate a compressed bit stream in response to contexts and binary decisions from the context model based on probability estimates generated thereby.

2. The apparatus defined in claim 1 wherein the context model comprises:
   a history block to generate history information in response to a current bit and input data;
   an address generation block coupled to the history block to generate at least one address in response to history information received from the history block;
   a memory coupled to the address generation block to store contexts and output at least one context in response to said at least one address.

3. The apparatus defined in claim 2 further comprising a selection block coupled to the memory and the history block to select one of said at least one contexts based on the history information.

4. The apparatus defined in claim 3 wherein the address generation block comprises a hashing mechanism.

5. The apparatus defined in claim 4 wherein each memory location in the memory for each hashed context contains context splitting information and a description of the context assigned to the hash value addressing said each memory location.

TABLE 7

| Time | 0 | 1 | 2 | 3 | 4 | 5 | 6 | 7 | 8 | 9 | 10 |
|---|---|---|---|---|---|---|---|---|---|---|---|
| CM 0 | 0,0,0 | 8,0,0 | 16,0,0 | 24,0,0 | 0,4,0 | 8,4,0 | 16,4,0 | 24,4,0 | 1,0,0 | 9,0,0 | 17,0,0 |
| CM 1 | idle | idle | 0,1,1 | 8,1,1 | 16,1,1 | 24,1,1 | 0,5,1 | 8,5,1 | 16,5,1 | 24,5,1 | 1,0,1 |
| CM 2 | idle | idle | idle | idle | 0,2,2 | 8,2,2 | 16,2,2 | 24,2,2 | 0,6,2 | 8,6,2 | 16,2,2 |
| CM 3 | idle | idle | idle | idle | idle | idle | 0,3,3 | 8,3,3 | 16,3,3 | 24,3,3 | 0,7,3 |

Whereas, many alterations and modifications of the present invention will no doubt become apparent to a person of ordinary skill in the art after having read the foregoing description, it is to be understood that the various embodiments shown and described by way of illustration are in no way to be considered limiting. Therefore, reference to the details of the various embodiments are not intended to limit the scope of the claims which themselves recite only those features regarded as essential to the invention.

Thus, a system and method for compression and decompression of arbitrary data has been described.

6. The apparatus defined in claim 2 wherein the address generation block comprises a hashing mechanism.

7. The apparatus defined in claim 1 wherein the context model comprises at least 0th, 1st and 2nd order contexts, where the 0th order uses no history of prior symbols and coding is performed according to frequency of occurrence of each symbol.

8. The apparatus defined in claim 7 wherein the context model creates eight binary decisions for each symbol when using the 0th order context with each binary decision using all past decisions in the same symbol as a context.

9. The apparatus defined in claim 8 wherein the 1st order context model uses one previous byte of information, such that each context comprises 16 bits of information corresponding to 8 bits of the previous byte and 8 bits for the 0th order contexts.

10. The apparatus defined in claim 9 wherein the 2nd order context model uses two previous byte of information, such that each context comprises 24 bits of information corresponding to 16 bits for the previous two bytes and 8 bits for the 0th order contexts.

11. The apparatus defined in claim 7 wherein initially only a predetermined number of contexts are available for use, and additional contexts are activated thereafter.

12. The apparatus defined in claim 1 wherein the context model comprises an adaptive model having a variable number of contexts as the input data stream is compressed.

13. The apparatus defined in claim 1 wherein the context model comprises an n-order context model using n previous bytes of information and requires $8 \times (n+1)$ bits for $2^{8n} \times 255$ context bins.

14. An apparatus for compressing an input symbol stream comprising:
- a context model operable with data of different types to model individual bits of symbols in the input symbol stream, said model using different order models to generate a context and a decision for each symbol; and
- a binary entropy coder coupled to the context model;
- wherein the context model comprises context splitting logic to activate context bins from a plurality of inactive context bins and allocate memory for such activated context bins as symbols in the input symbol stream are coded, and further wherein the context model comprises
- a history block to generate history information in response to a current bit and input data;
- a hashing mechanism coupled to the history block to generate a hash value in response to history information received from the history block;
- a memory coupled to the hashing mechanism to store contexts and output at least one context in response to the hash value; and
- a selection block coupled to the memory and the history block to select one of said at least one contexts based on the history information.

15. The apparatus defined in claim 14 wherein the context splitting logic activates a higher order context bin when a count value reaches a predetermined threshold.

16. The apparatus defined in claim 15 wherein the count value is incremented by a variable amount each time the nth order context is used.

17. The apparatus defined in claim 16 wherein the variable amount is related to the proximity of the nth order probability estimate is to 50 percent.

18. The apparatus defined in claim 15 wherein the count value is incremented for an (n+1)th order context when an nth order context bin is used.

19. The apparatus defined in claim 15 wherein the count value is incremented by a constant each time the nth order context is used.

20. The apparatus defined in claim 15 wherein an initial probability estimate for a newly activated context bin comprises a default probability estimation state.

21. The apparatus defined in claim 15 wherein an initial probability estimate for the activated (n+1)th order context bin comprises a probability estimation state of the nth order context.

22. The apparatus defined in claim 15 wherein an initial probability estimate for the activated context bin comprises a probability estimation state based on bits that would have been coded using the context bin if always activated.

23. The apparatus defined in claim 15 wherein a probability estimate for the activated (n+1)th order context bin is increased if the (n+1)th order context bin has a most probable symbol (MPS) different than an MPS of the nth order context.

24. The apparatus defined in claim 15 wherein a probability estimate for the activated (n+1)th order context is increased if no least probable symbol occurs in the (n+1)th order context prior to activation.

25. The apparatus defined in claim 14 wherein the context model uses different models of Nth order where N is greater than or equal to 2.

26. The apparatus defined in claim 25 wherein the hashing mechanism assigns at least one higher order context to a memory location for access therefrom.

27. The apparatus defined in claim 26 wherein context bins below the nth order contexts do not use hashing.

28. The apparatus defined in claim 14 wherein, when the context model uses an nth order context bin, the context model updates statistics corresponding to a context bin of an order higher than the nth order.

29. The apparatus defined in claim 28 wherein the context model updates statistics corresponding to at least one (n+1)th order context bin when an nth order context is used.

30. The apparatus defined in claim 14 wherein the context model uses lower order contexts until a particular higher order context occurs often enough that an expectation exists that using the higher order context allows for better compression.

31. The apparatus defined in claim 14 wherein the context model models at least two bits in at least one symbol with different order context bins.

32. An apparatus for compressing an input symbol stream comprising:
- an adaptive DMC context model operable with arbitrary data comprising character and non-character data types to generate contexts and binary decisions for individual bits in the input symbol stream, wherein the context model comprises having a plurality of banks of memory in which each bank stores information for one or more distinct states that each include a value representing a number of bits that have been through the state and a relative number of 1 and 0 bits and include pointers to the next state for 0 and 1 input bits, and where states split if additional space is available in the bank in which it is stored, and further wherein information in the plurality of banks is implicitly addressed by bit position; and
- a binary entropy coder coupled to the context model to code binary decisions into a compressed data stream based on generated probability estimates.

33. The apparatus defined in claim 32 wherein further comprising a state table containing counts, wherein each context has a pointer into the table.

34. The apparatus defined in claim 33 wherein the state table provides both splitting rules and probability estimates.

35. The apparatus defined in claim 34 wherein states are split if the current branch is used more than a threshold number of times.

36. The apparatus defined in claim 32 wherein the context model comprises:
- a probability, estimation table containing both probability, estimates and state splitting information for states and contains, for each state, a code for each context, next states on an LPS and on an MPS, and next states on splits on LPS and MPS.

37. The apparatus defined in claim 36 wherein the state splitting information comprises a threshold value indicating a number of times a branch in the DMC context model is used to allow state splitting thereafter.

38. The apparatus defined in claim 32 wherein banks in the memory are selected based on a predetermined number of previous bits and the bit position.

39. The apparatus defined in claim 38 wherein a new bank is selected by combining a bit position counter, the previous bits and the value stored in the current state.

40. The apparatus defined in claim 32 wherein the binary entropy coder comprises a plurality, of binary, compressors.

41. A method of compressing an input stream containing a plurality of symbols, said method comprising the steps of:
generating a context and a decision for each bit of each symbol in the input stream;
splitting the current state based on information in a state table based on if more memory exists in the same bank as the current state to dynamically allocate memory for an additional state in the same bank;
generating a probability estimate using the state table; and coding decisions into a compressed data stream.

42. The method defined in claim 41 further comprising the steps of selecting a bank based on a predetermined number of previous bits and the bit position as indicated by a pointer.

43. A system for compressing data comprising:
a plurality of buffers for storing uncompressed data;
a DMC model comprising
a plurality of context models, each of said plurality of context models coupled to an individual one of the plurality of buffers to receive context information, wherein the context models operate in parallel to provide contexts and binary decisions for individual bits;
a plurality of banks of memory storing state information corresponding to contexts, wherein each of the plurality of context models examines data in the memory bank following generation of a binary decision and context for a current bit;
a switching mechanism coupled to the plurality of context models to direct address and data information between the plurality of context models and the plurality of banks of memory, such that there is no contention between context models for the same bank of memory, wherein each context model accesses a distinct bank to obtain state information and another distinct bank to obtain split information; and
a plurality of coders associated with each of the plurality of buffers and coupled to the plurality of context models, wherein the coders operate in a staggered manner to always access different memory banks.

44. The system defined in claim 43 wherein the plurality of banks comprise logical banks.

45. The system defined in claim 43 wherein the switching mechanism comprises a crossbar switch.

46. A compression system comprising:
a buffer memory that stores uncompressed data;
a DMC model comprising
a plurality of context models coupled to the buffer memory to generate a plurality of contexts for individual bits in the uncompressed data in response to state and history information, wherein the plurality of context models are coupled to each other to pass information;
a plurality of memory banks, wherein individual states of the DMC context model are stored in each of the plurality of banks and further wherein each of the plurality of context models is distinctly coupled to access a first bank for context information and a second bank to access splitting information;
a parallel entropy coder coupled to the plurality of context models to generate a compressed bit stream in response to binary decisions and contexts from the plurality of context models.

47. The system defined in claim 46 wherein one of the plurality of context models comprises:
a state register storing a present state, wherein said one context model accesses the plurality of memory banks to obtain count information;
a count-to-code unit coupled to receive the count information from the plurality of memory banks and convert the count information into a code used by the parallel entropy coder to generate the compressed bit stream.

48. The system defined in claim 47 wherein the information passed between the plurality of context models comprises history information.

49. The system defined in claim 47 wherein said one context model further comprises update logic coupled to the plurality of memory banks to update counts in the plurality of memory banks in response to the count information.

50. The system defined in claim 47 wherein said one context model further comprises splitting logic that splits states, based on the context information, used to generate contexts.

51. The system defined in claim 46 wherein the plurality of memory banks comprise logical banks.

52. The system defined in claim 46 wherein the buffer memory comprises shift register.

53. The system defined in claim 46 wherein the information comprises state information.

54. The system defined in claim 46 wherein the plurality of memory banks comprise logical banks.

55. The system defined in claim 46 wherein the buffer memory comprises shift register.

56. A decompression system for decompressing a compressed bit stream of arbitrary data comprised of character and non-character data, said system comprising:
a buffer memory that stores compressed data;
an adaptive DMC model comprising
a plurality of context models coupled to the buffer memory to generate a plurality of contexts in response to state and history information and the decompressed data;
a plurality of memory banks, wherein individual states of the DMC context model are stored in each of the plurality of banks and further wherein each of the plurality of context models is distinctly coupled to access a first bank for context information and a second bank to access splitting information;
a parallel entropy decoder coupled to the plurality of context models to reconstruct a bit stream in response to the decompressed data and contexts from the plurality of contexts.

57. An apparatus for decompressing a compressed data stream comprising:
a model operable with arbitrary data to model individual bits, wherein the arbitrary types of data comprises data of a first bit length and a second bit length not equal to the first bit length, wherein said model uses various orders to generate a context for each bit in the compressed data stream, and further comprising context splitting logic that adaptively activates contexts of orders higher than those active while decoding of the compressed data occurs;

a binary entropy decoder coupled to the model that generates a result indicative of whether a decision was at its most probable state or not, wherein the context model generates reconstructed data in response to the result, wherein the context model uses nth order contexts and binary decisions, where n is greater than or equal to 0 and updates statistics for an (n+1)th order context while decoding with nth order contexts, said context model determining if a currently non-active (n+1)th order context is to be activated for future use and activating the currently non-active (n+1)th order context if determined to be activated.

58. The apparatus defined in claim 57 wherein the context model only uses Nth order context bins initially, where N is greater than or equal to 0.

59. The apparatus defined in claim 58 wherein the Nth order comprises a 0th order.

60. The apparatus defined in claim 57 wherein the context model is adaptive in that the context model activates context bins from a plurality of inactive context bins and allocates memory for such context bins as bits in the compressed bit stream are decompressed.

61. A method of compressing arbitrary data, wherein the arbitrary data comprises data of a plurality of types, said method comprising the steps of:

(a) generating a context and a binary decision for each bit in the arbitrary data;

(b) binary entropy coding the arbitrary data using nth order contexts and binary decisions, where n is greater than or equal to 0;

(c) updating statistics for an (n+1)th order context while coding with nth order contexts;

(d) determining if a currently non-active (n+1)th order context is to be activated for future use; and (e) activating the currently non-active (n+1)th order context if determined to be activated.

62. The method defined in claim 61 further comprising the step of activating the (n+1)th order context model when a count value reaches a threshold that is chosen based on a length of time coding occurs to obtain a probability estimate that allows for better compression than the nth order context model.

63. The method defined in claim 62 further comprising the step of incrementing a count value for an associated (n+1)th order context.

64. The method defined in claim 62 wherein the count value is incremented by an amount based on how close a probability estimate of the nth order context is to 50%.

65. The method defined in claim 61 wherein the step of activating the (n+1)th order context comprises allocating memory to the (n+1)th order context.

66. The method defined in claim 65 wherein the step of allocating memory comprises assigning memory to the (n+1)th order context using a hashing function.

67. The method defined in claim 65 wherein a memory location for the (n+1)th order context contains context splitting information and a description of the (n+1)th order context to identify the (n+1)th order context as being assigned to a particular hash value.

68. The method defined in claim 61 further comprising the step of repeating steps (a)–(e) until all contexts used by the data are active.

69. The method defined in claim 61 further comprising the step of updating statistics for a (n+2)th order context model corresponding to the currently non-active (n+1)th order context model only after the currently non-active (n+1)th order context model is activated.

70. The method defined in claim 61 wherein at least two bits in at least one byte are modeled using different order context bins.

71. The method defined in claim 61 wherein the step of determining if the currently non-active (n+1)th order context model is to be activated for future use comprises the steps of:

determining if an expectation exists that using the (n+1)th order context model allows for better compression than the nth order context model; and activating the (n+1)th order context model when the expectation exists.

72. The method defined in claim 61 further comprising the steps of:

for each bit in a character, examining all possible orders to determine the highest order context bin that is active that applies to the bit, where an individual context model is active when a probability estimate exists for the individual context model;

coding the bit with the highest order context bin that is active; and updating a context model that is one order higher than the highest order context bin that is active if the one order is less than the maximum possible order.

73. The method defined in claim 61 further comprising the step of activating the (n+1)th order context model when its memory is allocated.

74. The method defined in claim 61 further comprising the step of activating the (n+1)th order context model only after coding enough data that could have been coded using the (n+1)th order context model had the (n+1)th order context model been active that an expectation exists that using the (n+1)th order context allows for better compression than another nth order context model.

75. The method defined in claim 61 wherein the plurality of types comprises character and non-character data.

76. The method defined in claim 61 further comprising the step of the hashing to a location in memory used assigned to a context to determine if the context is active.

77. The method defined in claim 61 further comprising the steps of:

activating one of the nth order contexts; and updating an (n+1)th order context model associated with said one nth order context only after said one nth order context model has been activated.

78. The method defined in claim 61 further comprising the step of stopping activation of additional contexts where a context bin has adapted to a maximum skew code.

79. The method defined in claim 61 further comprising the step of assigning a probability estimate for the (n+1)th order context, where the probability estimate is a default value.

80. The method defined in claim 61 further comprising the step of assigning a probability estimate for the (n+1)th order context, where the probability estimate is the same as the probability estimate for the nth order context.

81. The method defined in claim 61 further comprising the step of assigning a probability estimate for the (n+1)th order context, where the probability estimate is based on bits that would have been coded by the (n+1)th order context model if active.

* * * * *